United States Patent
Dai et al.

(10) Patent No.: US 9,240,156 B2
(45) Date of Patent: Jan. 19, 2016

(54) GATE-DRIVER-ON-ARRAY (GOA) CIRCUIT

(71) Applicant: Shenzhen China Star Optoelectronics Technology Co., Ltd., Shenzhen, Guangdong (CN)

(72) Inventors: Chao Dai, Shenzhen (CN); Juncheng Xiao, Shenzhen (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 96 days.

(21) Appl. No.: 14/241,078

(22) PCT Filed: Jan. 21, 2014

(86) PCT No.: PCT/CN2014/070947
§ 371 (c)(1),
(2) Date: Feb. 25, 2014

(87) PCT Pub. No.: WO2015/089932
PCT Pub. Date: Jun. 25, 2015

(65) Prior Publication Data
US 2015/0279288 A1     Oct. 1, 2015

(30) Foreign Application Priority Data

Dec. 20, 2013   (CN) .......................... 2013 1 0712607

(51) Int. Cl.
*G09G 3/36*     (2006.01)
*G11C 19/28*    (2006.01)
(Continued)

(52) U.S. Cl.
CPC .......... *G09G 3/3677* (2013.01); *G02F 1/13306* (2013.01); *G02F 1/13454* (2013.01);
(Continued)

(58) Field of Classification Search
CPC .................. G09G 3/3607; G09G 2300/0809; G09G 2310/0248; G09G 2320/0242; G09G 2320/0252; G09G 3/3677; G09G 2300/0408; G09G 2310/0286; G09G 3/3688; G09G 3/3648; G09G 2310/027; G02F 1/13306; G02F 1/13454; G11C 19/28
USPC .................................... 345/87–100, 690–699
See application file for complete search history.

(56) References Cited

U.S. PATENT DOCUMENTS

2007/0195053 A1* 8/2007 Tobita et al. .................. 345/100
2008/0048712 A1   2/2008 Ahn et al.
(Continued)

FOREIGN PATENT DOCUMENTS

| CN | 101639598 A | 2/2010 |
|----|-------------|--------|
| CN | 102136241 A | 7/2011 |
| CN | 103021360 A | 4/2013 |
| CN | 103310755 A | 9/2013 |

*Primary Examiner* — Dmitriy Bolotin
(74) *Attorney, Agent, or Firm* — Andrew C. Cheng

(57) ABSTRACT

The present invention provides a GOA (Gate-Driver-on-Array) circuit, which includes multiple GOA units connected in cascade. An nth stage GOA unit of the GOA circuit includes a first (n−1)th stage signal input terminal (21), a second (n−1)th stage signal input terminal (22), a (n+1)th stage signal input terminal (23), a first clock signal input terminal (24), a first low level input terminal (25), a second low level input terminal (26), a first output terminal (27), and a second output terminal (28). The nth stage GOA unit further includes: a pull-up control unit (42), a pull-up unit (44), a first pull-down holding unit (46), a second pull-down holding unit (47), and a pull-down unit (48). The GOA circuit of the present invention overcomes the problems of poor performance of the conventional the GOA circuit caused by introduction of two low level signals into the GOA circuit and short operation service life and can enhance the quality of displayed images.

13 Claims, 10 Drawing Sheets

(51) Int. Cl.
*G02F 1/133* (2006.01)
*G02F 1/1345* (2006.01)

(52) U.S. Cl.
CPC .............. *G09G3/3607* (2013.01); *G11C 19/28* (2013.01); *G09G 2300/0408* (2013.01); *G09G 2300/0809* (2013.01); *G09G 2310/0248* (2013.01); *G09G 2310/0286* (2013.01); *G09G 2320/0242* (2013.01); *G09G 2320/0252* (2013.01)

(56) References Cited

U.S. PATENT DOCUMENTS

| 2010/0260312 | A1 | 10/2010 | Tsai et al. | |
|---|---|---|---|---|
| 2014/0159999 | A1* | 6/2014 | Gu et al. | 345/100 |
| 2015/0029082 | A1* | 1/2015 | Jeon et al. | 345/98 |
| 2015/0077319 | A1* | 3/2015 | Yao et al. | 345/100 |
| 2015/0194112 | A1* | 7/2015 | Koo et al. | 345/100 |

\* cited by examiner

GATE-DRIVER-ON-ARRAY (GOA) CIRCUIT

BACKGROUND OF THE INVENTION

1. Field of the Invention

The present invention relates to the field of liquid crystal displaying, and in particular to a gate-driver-on-array (GOA) circuit.

2. The Related Arts

Liquid crystal displays (LCDs) have a variety of advantages, such as thin device body, low power consumption, and being free of radiation, and are thus widely used. The development of the liquid crystal display industry brings in increasingly severer performance requirements, such as performance related to high resolution, high brightness, wide view angle, and low power consumption, and associated techniques have been developed. Most of the liquid crystal displays that are currently available in the market are backlighting liquid crystal displays, which comprise a liquid crystal display panel and a backlight module. The operation principle of the liquid crystal display panel is that, with liquid crystal molecules interposed between two parallel glass substrates, application of a drive voltage is selectively carried out by means of a driver circuit to the two glass substrates to control the liquid crystal molecules to change direction in order to refract out light emitting from the backlight module for generating images.

The recent development of the LCDs is toward high integration and low cost of which an important technique is the realization of mass production of gate driver on array (GOA) technique. The GOA technique uses the front-stage array process of TFT-LCD (Thin-Film Transistor Liquid Crystal Display) to make a gate line scan drive signal circuit on an array substrate of a liquid crystal display panel in order to achieve progressive gate scanning. Using the GOA technique to integrate the gate line scan drive signal circuit on the array substrate of the liquid crystal display panel allows for omission of a gate driver integrated circuit so as to reduce the cost of product in both material cost and manufacturing operation. Such a gate line scan drive signal circuit that is integrated on an array substrate by means of the GOA technique is also referred to as a GOA circuit. The GOA circuit comprises a plurality of GOA units and as show in FIG. 1, a circuit diagram of a GOA unit of a conventional GOA circuit is shown, comprising: a pull-up circuit 100, a pull-up control circuit 200, a pull-down circuit 300, a first pull-down holding circuit 400, and a second pull-down holding circuit 500, wherein the pull-up circuit 100 functions to output a clock signal CKn as a gate signal $G_n$. The pull-up control circuit 200 controls the activation time of the pull-up circuit 100 and is generally connected to a transfer signal $ST_{n-1}$ transmitted from a previous stage GOA unit and the gate signal $G_{n-1}$ thereof. The first pull-down holding circuit 400 pulls the gate line down to a low voltage at first time, namely shutting off the gate signal. The second pull-down holding circuit 500 functions to maintain the gate signal $G_n$ and a control signal $Q_n$ of the pull-up circuit 100 at a shut-off condition (namely a negative potential). The GOA circuit is commonly provided with two low level signal lines and the two low level signal lines respectively supply a first low level signal $V_{ss1}$ and a second low level signal $V_{ss2}$, whereby the second low level $V_{ss2}$ is used to reduce the voltage difference $V_{gs}$ between the gate terminal and the source terminal of the pull-up circuit 100 when the scan circuit is at a closed (holding) time so as to reduce the leakage currents of the pull-up circuit 100 and the second pull-down holding circuit 500. A capacitor $C_{boost}$ provides secondary boost of the control signal $Q_n$ of the pull-up circuit 100 to facilitate the output of the gate signal $G_n$.

However, the conventional GOA circuit suffers the following two shortcomings:

(1) A conductive path exists between two different negative potentials. Referring to FIG. 2, which is an equivalent circuit diagram of FIG. 1, L100 indicates a loop of the leakage current induced by the connection of a thin-film transistor T110 to the previous stage GOA unit and L200 indicates a loop of the leakage current induced by the connection of a thin-film transistor T410 to the instant stage GOA unit. The conventional GOA circuit would cause an effect of a great current between the leakage current loops L100 and L200. The magnitude of the current is directly related to the potentials of pull-down points $P_n$ and $K_n$. Further, the current conducted therethrough is proportional to the number of the stages of the GOA circuit. This leads to an increase of the loading of the signal sources of $V_{ss1}$ and $V_{ss2}$ and in the worst case, abnormality of image displaying may result.

(2) The diode design of thin-film transistors T510 and T610 makes it is not possible for the high voltage of the pull-down points $P_n$ and $K_n$ to be quickly released and the voltage variations at the points of $P_n$ and $K_n$ are illustrated in FIG. 3. This increases the influence of stress on four primary thin-film transistors T320, T420, T330, T430 of the first and second pull-down holding circuits 400, 500, eventually affecting the operation service life of the GOA circuit.

SUMMARY OF THE INVENTION

An object of the present invention is to provide a GOA (Gate-Driver-on-Array) circuit, which uses a GOA technique to reduce the cost of a liquid crystal display and to overcome the problems of poor performance of the conventional the GOA circuit caused by introduction of two low level signals into the GOA circuit and short operation service life of the GOA circuit and enhance the quality of displayed images.

To achieve the above object, the present invention provides a GOA circuit, which comprises multiple stages of GOA units connected in cascade, wherein:

for each nth stage GOA unit between the second stage and the last second stage of the GOA circuit, the nth stage GOA unit comprises a first (n−1)th stage signal input terminal, a second (n−1)th stage signal input terminal, a (n+1)th stage signal input terminal, a first output terminal, and a second output terminal, wherein the first output terminal of the nth stage GOA unit is provided for driving an active zone of an array substrate; the first (n−1)th stage signal input terminal, the second (n−1)th stage signal input terminal, and the (n+1)th stage signal input terminal of the nth stage GOA unit are respectively and electrically connected to the first output terminal and the second output terminal of the (n−1)th GOA unit and the first output terminal of the (n+1)th GOA unit, the first output terminal of the nth stage GOA unit being electrically connected to the first (n−1)th stage signal input terminal of the (n+1)th GOA unit and the (n+1)th stage signal input terminal of the (n−1)th GOA unit, the second output terminal of the nth stage GOA unit being electrically connected to the second (n−1)th stage signal input terminal of the (n+1)th GOA unit;

for the nth stage GOA unit at the first stage of the GOA circuit, the nth stage GOA unit comprises a first (n−1)th stage signal input terminal, a second (n−1)th stage signal input terminal, a (n+1)th stage signal input terminal, a first output terminal, and a second output terminal, wherein the first output terminal of the nth stage GOA unit is provided for driving an active zone of an array substrate; the first (n−1)th stage signal input terminal and the second (n−1)th stage signal input terminal of the nth stage GOA unit both provided for receiving an input of a pulse activation signal and the (n+1)th stage signal input terminal is electrically connected to the first output terminal of the (n+1)th GOA unit, the first output terminal and the second output terminal of the nth stage GOA unit being respectively and electrically connected to the first (n−1)th stage signal input terminal and the second (n−1)th stage signal input terminal of the (n+1)th GOA unit;

for the nth stage GOA unit at the last stage of the GOA circuit, the nth stage GOA unit comprises a first (n−1)th stage signal input terminal, a second (n−1)th stage signal input terminal, a (n+1)th stage signal input terminal, a first output terminal, and a second output terminal; the first (n−1)th stage signal input terminal and the second input terminal of the nth stage GOA unit are respectively and electrically connected to the first output terminal and the second output terminal of the (n−1)th GOA unit, the (n+1)th stage signal input terminal of the nth stage GOA unit being provided to receive an input of a pulse activation signal, the first output terminal of the nth stage GOA unit being electrically connected to the (n+1)th stage signal input terminal of the (n−1)th GOA unit and the second output terminal being open;

for each nth stage GOA unit between the first stage and the last stage of the GOA circuit, the nth stage GOA unit further comprises a first clock signal input terminal, a first low level input terminal, and a second low level input terminal, the first low level input terminal being provided for receiving an input of a first low level, the second low level input terminal being provided for receiving an input of a second low level, the second low level being smaller than the first low level;

for each nth stage GOA unit between the first stage and the last stage of the GOA circuit, the nth stage GOA unit further comprises:

a pull-up control unit, which is electrically connected to the first (n−1)th stage signal input terminal and the second (n−1)th stage signal input terminal;

a pull-up unit, which is electrically connected to the pull-up control unit and the first clock signal input terminal, the first output terminal, and the second output terminal;

a first pull-down holding unit, which is electrically connected to the first low level input terminal, the second low level input terminal, the pull-up control unit, and the pull-up unit;

a second pull-down holding unit, which is electrically connected to the first low level input terminal, the second low level input terminal, the first pull-down holding unit, the pull-up control unit, and the pull-up unit; and a pull-down unit, which is electrically connected to the (n+1)th stage signal input terminal, the first low level input terminal, the pull-up control unit, the pull-up unit, the first pull-down holding unit, the second pull-down holding unit, and the first output terminal.

The first clock signal input terminal has an input signal that is a first clock signal or a second clock signal, the first clock signal being opposite in phase to the second clock signal; when the input signal of the first clock signal input terminal of the nth stage GOA unit of the GOA circuit is the first clock signal, the input signal of the first clock signal input terminal of the (n+1)th stage GOA unit of the GOA circuit is the second clock signal.

The pull-up control unit is a first thin-film transistor and the first thin-film transistor comprises a first gate terminal, a first source terminal, and a first drain terminal, wherein the first gate terminal is electrically connected to the second (n−1)th stage signal input terminal; the first source terminal is electrically connected to the first (n−1)th stage signal input terminal; and the first drain terminal is electrically connected to the first and second pull-down holding units, the pull-down unit, and the pull-up unit.

The pull-up unit comprises a capacitor, a second thin-film transistor, and a third thin-film transistor and the second thin-film transistor comprises a second gate terminal, a second source terminal, and a second drain terminal and the third thin-film transistor comprises a third gate terminal, a third source terminal, and a third drain terminal, wherein the second gate terminal is electrically connected to one end of the capacitor, the first drain terminal, the third gate terminal, the first and second pull-down holding units, and the pull-down unit; the second source terminal is electrically connected to the third source terminal and the first clock signal input terminal; the second drain terminal is electrically connected to the second output terminal; and the third drain terminal is electrically connected to the first output terminal, the first and second pull-down holding units, the pull-down unit, and an opposite end of the capacitor.

The pull-down unit comprises fourth and fifth thin-film transistors and the fourth thin-film transistor comprises a fourth gate terminal, a fourth source terminal, and a fourth drain terminal and the fifth thin-film transistor comprises a fifth gate terminal, a fifth source terminal, and a fifth drain terminal, wherein the fourth gate terminal is electrically connected to the fifth gate terminal and the (n+1)th stage signal input terminal; the fourth source terminal is electrically connected to a first low level input terminal and the fifth source terminal; the fourth drain terminal is electrically connected to the first drain terminal, said one end of the capacitor, the second gate terminal, the third gate terminal, and the first and second pull-down holding units; and the fifth drain terminal is electrically connected to the first output terminal, the third source terminal, said opposite end of the capacitor, and the first and second pull-down holding units.

The first pull-down holding unit comprises sixth to ninth thin-film transistors and the sixth thin-film transistor comprises a sixth gate terminal, a sixth source terminal, and a sixth drain terminal; the seventh thin-film transistor comprises a seventh gate terminal, a seventh source terminal, and a seventh drain terminal; the eighth thin-film transistor comprises an eighth gate terminal, an eighth source terminal, and an eighth drain terminal; and the ninth thin-film transistor comprises a ninth gate terminal, a ninth source terminal, and a ninth drain terminal, wherein the sixth drain terminal is electrically connected to the seventh drain terminal, the eighth gate terminal, and the ninth gate terminal; the seventh gate terminal is electrically connected to the first drain terminal, the ninth drain terminal, said one end of the capacitor, the second gate terminal, the third gate terminal, the fourth drain terminal, and the second pull-down holding unit; the seventh source terminal is electrically connected to a second low level input terminal; the eighth drain terminal is electrically connected to said opposite end of the capacitor, the second pull-down holding unit, and the first output terminal; the eighth source terminal is electrically connected to the first low level input terminal; and the ninth source terminal is electrically connected to the first low level input terminal; and the second pull-down holding unit comprises tenth to thirteenth thin-film transistors and the tenth thin-film transistor comprises a tenth gate terminal, a tenth source terminal, and a tenth drain terminal; the eleventh thin-film transistor comprises an eleventh gate terminal, an eleventh source terminal, and an eleventh drain terminal; the twelfth thin-film transistor comprises a twelfth gate terminal, a twelfth source terminal, and a twelfth drain terminal; and the thirteenth thin-film transistor comprises a thirteenth gate terminal, a thirteenth source terminal, and a thirteenth drain terminal, wherein the tenth drain terminal is electrically connected to the eleventh drain terminal, the twelfth gate terminal, and the thirteenth gate terminal; the eleventh gate terminal is electrically connected to the first drain terminal, the thirteenth drain terminal, the seventh gate terminal, the ninth drain terminal, and said one end of the capacitor; the eleventh source terminal is electrically connected to the second low level input terminal; the twelfth drain terminal is electrically connected to said opposite end of the capacitor, the eighth drain terminal, and the first output terminal; the twelfth source terminal is electrically connected to the first low level input terminal; and the thirteenth source terminal is electrically connected to the first low level input terminal.

The nth stage GOA unit of the GOA circuit further comprises a second clock signal input terminal and a third clock signal input terminal, the sixth gate terminal and the sixth source terminal being connected to the second clock signal input terminal, the tenth gate terminal and the tenth source terminal being connected to the third clock signal input terminal, the second clock signal input terminal receiving an input of the first clock signal, the third clock signal input terminal receiving an input of the second clock signal.

The first pull-down holding unit further comprises a fourteenth thin-film transistor and the fourteenth thin-film transistor comprises a fourteenth gate terminal, a fourteenth source terminal, and a fourteenth drain terminal, wherein the fourteenth drain terminal is electrically connected to the sixth drain terminal, the seventh drain terminal, the eighth gate terminal, and the ninth gate terminal; and the fourteenth source terminal is electrically connected to the sixth gate terminal, the sixth source terminal, and the second clock signal input terminal; and the second pull-down holding unit further comprises a fifteenth thin-film transistor and the fifteenth thin-film transistor comprises a fifteenth gate terminal, a fifteenth source terminal, and a fifteenth drain terminal, wherein the fifteenth drain terminal is electrically connected to the tenth drain terminal, the eleventh drain terminal, the twelfth gate terminal, and the thirteenth gate terminal and the fifteenth source terminal is electrically connected to the tenth gate terminal and the tenth source terminal.

The nth stage GOA unit of the GOA circuit further comprises a second clock signal input terminal and a third clock signal input terminal; the sixth gate terminal, the sixth source terminal, and the fourteenth source terminal are connected to the second clock signal input terminal; the fourteenth gate terminal is connected to the third clock signal input terminal; the tenth gate terminal, the tenth source terminal, and the fifteenth source terminal are connected to the third clock signal input terminal; the fifteenth gate terminal is connected to the second clock signal input terminal; and the second clock signal input terminal receives an input of the first clock signal and the third clock signal input terminal receives an input of the second clock signal.

The nth stage GOA unit of the GOA circuit further comprises a first low frequency signal input terminal and a second low frequency input terminal, the sixth gate terminal; the sixth source terminal and the fourteenth source terminal are connected to the first low frequency signal input terminal; the fourteenth gate terminal is connected to the second low frequency signal input terminal; the tenth gate terminal, the tenth source terminal, and the fifteenth source terminal are connected to the second low frequency signal input terminal; the fifteenth gate terminal is connected to the first low frequency signal input terminal; and the first low frequency signal input terminal receives an input of a low frequency signal or an ultralow frequency signal and the second low frequency signal input terminal receives an input of a low frequency signal or an ultralow frequency signal.

The present invention further provides a GOA circuit, comprising multiple stages of GOA units connected in cascade, wherein:

for each nth stage GOA unit between the second stage and the last second stage of the GOA circuit, the nth stage GOA unit comprises a first (n−1)th stage signal input terminal, a second (n−1)th stage signal input terminal, a (n+1)th stage signal input terminal, a first output terminal, and a second output terminal, wherein the first output terminal of the nth stage GOA unit is provided for driving an active zone of an array substrate; the first (n−1)th stage signal input terminal, the second (n−1)th stage signal input terminal, and the (n+1)th stage signal input terminal of the nth stage GOA unit are respectively and electrically connected to the first output terminal and the second output terminal of the (n−1)th GOA unit and the first output terminal of the (n+1)th GOA unit, the first output terminal of the nth stage GOA unit being electrically connected to the first (n−1)th stage signal input terminal of the (n+1)th GOA unit and the (n+1)th stage signal input terminal of the (n−1)th GOA unit, the second output terminal of the nth stage GOA unit being electrically connected to the second (n−1)th stage signal input terminal of the (n+1)th GOA unit;

for the nth stage GOA unit at the first stage of the GOA circuit, the nth stage GOA unit comprises a first (n−1)th stage signal input terminal, a second (n−1)th stage signal input terminal, a (n+1)th stage signal input terminal, a first output terminal, and a second output terminal, wherein the first output terminal of the nth stage GOA unit is provided for driving an active zone of an array substrate; the first (n−1)th stage signal input terminal and the second (n−1)th stage signal input terminal of the nth stage GOA unit both provided for receiving an input of a pulse activation signal and the (n+1)th stage signal input terminal is electrically connected to the first output terminal of the (n+1)th GOA unit, the first output terminal and the second output terminal of the nth stage GOA unit being respectively and electrically connected to the first (n−1)th stage signal input terminal and the second (n−1)th stage signal input terminal of the (n+1)th GOA unit;

for the nth stage GOA unit at the last stage of the GOA circuit, the nth stage GOA unit comprises a first (n−1)th stage signal input terminal, a second (n−1)th stage signal input terminal, a (n+1)th stage signal input terminal, a first output terminal, and a second output terminal; the first (n−1)th stage signal input terminal and the second input terminal of the nth stage GOA unit are respectively and electrically connected to the first output terminal and the second output terminal of the (n−1)th GOA unit, the (n+1)th stage signal input terminal of the nth stage GOA unit being provided to receive an input of a pulse activation signal, the first output terminal of the nth stage GOA unit being electrically connected to the (n+1)th stage signal input terminal of the (n−1)th GOA unit and the second output terminal being open;

for each nth stage GOA unit between the first stage and the last stage of the GOA circuit, the nth stage GOA unit further comprises a first clock signal input terminal, a first low level input terminal, and a second low level input terminal, the first low level input terminal being provided for receiving an input of a first low level, the second low level input terminal being provided for receiving an input of a second low level, the second low level being smaller than the first low level;

for each nth stage GOA unit between the first stage and the last stage of the GOA circuit, the nth stage GOA unit further comprises:

a pull-up control unit, which is electrically connected to the first (n−1)th stage signal input terminal and the second (n−1)th stage signal input terminal;

a pull-up unit, which is electrically connected to the pull-up control unit and the first clock signal input terminal, the first output terminal, and the second output terminal;

a first pull-down holding unit, which is electrically connected to the first low level input terminal, the second low level input terminal, the pull-up control unit, and the pull-up unit;

a second pull-down holding unit, which is electrically connected to the first low level input terminal, the second low level input terminal, the first pull-down holding unit, the pull-up control unit, and the pull-up unit; and a pull-down unit, which is electrically connected to the (n+1)th stage signal input terminal, the first low level input terminal, the pull-up control unit, the pull-up unit, the first pull-down holding unit, the second pull-down holding unit, and the first output terminal;

wherein the first clock signal input terminal has an input signal that is a first clock signal or a second clock signal, the first clock signal being opposite in phase to the second clock signal; when the input signal of the first clock signal input terminal of the nth stage GOA unit of the GOA circuit is the first clock signal, the input signal of the first clock signal input terminal of the (n+1)th stage GOA unit of the GOA circuit is the second clock signal;

wherein the pull-up control unit is a first thin-film transistor and the first thin-film transistor comprises a first gate terminal, a first source terminal, and a first drain terminal, wherein the first gate terminal is electrically connected to the second (n−1)th stage signal input terminal; the first source terminal is electrically connected to the first (n−1)th stage signal input terminal; and the first drain terminal is electrically connected to the first and second pull-down holding units, the pull-down unit, and the pull-up unit;

wherein the pull-up unit comprises a capacitor, a second thin-film transistor, and a third thin-film transistor and the second thin-film transistor comprises a second gate terminal, a second source terminal, and a second drain terminal and the third thin-film transistor comprises a third gate terminal, a third source terminal, and a third drain terminal, wherein the second gate terminal is electrically connected to one end of the capacitor, the first drain terminal, the third gate terminal, the first and second pull-down holding units, and the pull-down unit; the second source terminal is electrically connected to the third source terminal and the first clock signal input terminal; the second drain terminal is electrically connected to the second output terminal; and the third drain terminal is electrically connected to the first output terminal, the first and second pull-down holding units, the pull-down unit, and an opposite end of the capacitor;

wherein the pull-down unit comprises fourth and fifth thin-film transistors and the fourth thin-film transistor comprises a fourth gate terminal, a fourth source terminal, and a fourth drain terminal and the fifth thin-film transistor comprises a fifth gate terminal, a fifth source terminal, and a fifth drain terminal, wherein the fourth gate terminal is electrically connected to the fifth gate terminal and the (n+1)th stage signal input terminal; the fourth source terminal is electrically connected to a first low level input terminal and the fifth source terminal; the fourth drain terminal is electrically connected to the first drain terminal, said one end of the capacitor, the second gate terminal, the third gate terminal, and the first and second pull-down holding units; and the fifth drain terminal is electrically connected to the first output terminal, the third source terminal, said opposite end of the capacitor, and the first and second pull-down holding units; and wherein the first pull-down holding unit comprises sixth to ninth thin-film transistors and the sixth thin-film transistor comprises a sixth gate terminal, a sixth source terminal, and a sixth drain terminal; the seventh thin-film transistor comprises a seventh gate terminal, a seventh source terminal, and a seventh drain terminal; the eighth thin-film transistor comprises an eighth gate terminal, an eighth source terminal, and an eighth drain terminal; and the ninth thin-film transistor comprises a ninth gate terminal, a ninth source terminal, and a ninth drain terminal, wherein the sixth drain terminal is electrically connected to the seventh drain terminal, the eighth gate terminal, and the ninth gate terminal; the seventh gate terminal is electrically connected to the first drain terminal, the ninth drain terminal, said one end of the capacitor, the second gate terminal, the third gate terminal, the fourth drain terminal, and the second pull-down holding unit; the seventh source terminal is electrically connected to a second low level input terminal; the eighth drain terminal is electrically connected to said opposite end of the capacitor, the second pull-down holding unit, and the first output terminal; the eighth source terminal is electrically connected to the first low level input terminal; and the ninth source terminal is electrically connected to the first low level input terminal; and the second pull-down holding unit comprises tenth to thirteenth thin-film transistors and the tenth thin-film transistor comprises a tenth gate terminal, a tenth source terminal, and a tenth drain terminal; the eleventh thin-film transistor comprises an eleventh gate terminal, an eleventh source terminal, and an eleventh drain terminal; the twelfth thin-film transistor comprises a twelfth gate terminal, a twelfth source terminal, and a twelfth drain terminal; and the thirteenth thin-film transistor comprises a thirteenth gate terminal, a thirteenth source terminal, and a thirteenth drain terminal, wherein the tenth drain terminal is electrically connected to the eleventh drain terminal, the twelfth gate terminal, and the thirteenth gate terminal; the eleventh gate terminal is electrically connected to the first drain terminal, the thirteenth drain terminal, the seventh gate terminal, the ninth drain terminal, and said one end of the capacitor; the eleventh source terminal is electrically connected to the second low level input terminal; the twelfth drain terminal is electrically connected to said opposite end of the capacitor, the eighth drain terminal, and the first output terminal; the twelfth source terminal is electrically connected to the first low level input terminal; and the thirteenth source terminal is electrically connected to the first low level input terminal.

The nth stage GOA unit of the GOA circuit further comprises a second clock signal input terminal and a third clock signal input terminal, the sixth gate terminal and the sixth source terminal being connected to the second clock signal input terminal, the tenth gate terminal and the tenth source terminal being connected to the third clock signal input terminal, the second clock signal input terminal receiving an input of the first clock signal, the third clock signal input terminal receiving an input of the second clock signal.

The first pull-down holding unit further comprises a fourteenth thin-film transistor and the fourteenth thin-film transistor comprises a fourteenth gate terminal, a fourteenth source terminal, and a fourteenth drain terminal, wherein the fourteenth drain terminal is electrically connected to the sixth drain terminal, the seventh drain terminal, the eighth gate terminal, and the ninth gate terminal; and the fourteenth source terminal is electrically connected to the sixth gate terminal, the sixth source terminal, and the second clock signal input terminal; and the second pull-down holding unit further comprises a fifteenth thin-film transistor and the fifteenth thin-film transistor comprises a fifteenth gate terminal, a fifteenth source terminal, and a fifteenth drain terminal, wherein the fifteenth drain terminal is electrically connected to the tenth drain terminal, the eleventh drain terminal, the twelfth gate terminal, and the thirteenth gate terminal and the fifteenth source terminal is electrically connected to the tenth gate terminal and the tenth source terminal.

The nth stage GOA unit of the GOA circuit further comprises a second clock signal input terminal and a third clock signal input terminal; the sixth gate terminal, the sixth source terminal, and the fourteenth source terminal are connected to the second clock signal input terminal; the fourteenth gate terminal is connected to the third clock signal input terminal; the tenth gate terminal, the tenth source terminal, and the fifteenth source terminal are connected to the third clock signal input terminal; the fifteenth gate terminal is connected to the second clock signal input terminal; and the second clock signal input terminal receives an input of the first clock signal and the third clock signal input terminal receives an input of the second clock signal.

The nth stage GOA unit of the GOA circuit further comprises a first low frequency signal input terminal and a second low frequency input terminal, the sixth gate terminal; the sixth source terminal and the fourteenth source terminal are connected to the first low frequency signal input terminal; the fourteenth gate terminal is connected to the second low frequency signal input terminal; the tenth gate terminal, the tenth source terminal, and the fifteenth source terminal are connected to the second low frequency signal input terminal; the fifteenth gate terminal is connected to the first low frequency signal input terminal; and the first low frequency signal input terminal receives an input of a low frequency signal or an ultralow frequency signal and the second low frequency signal input terminal receives an input of a low frequency signal or an ultralow frequency signal.

The efficacy of the present invention is that the present invention provides a GOA circuit, which uses two low level signals to reduce the leakage currents of the thin-film transistors of a pull-down holding unit, wherein the second low level that has a lower level provides a low voltage to pull-down points $P_n$ and $K_n$ and the first low level that has a higher level provides a low voltage to the pull-down points $Q_n$ and $G_n$, so as to reduce the potentials of the pull-down point $P_n$ and $K_n$ when the pull-down point $Q_n$ and $G_n$ are activated to thereby facilitate charging of $Q_n$ and $G_n$ and also to break the leakage current loop of the circuit between two low level signals to greatly reduce the leakage current between the two low level signal, enhance the performance of the GOA circuit, and improve the quality of displayed images; further, the fourteenth thin-film transistor and the fifteenth thin-film transistor are additionally included in respect of the diode design of the sixth thin-film transistor and the tenth thin-film transistor to perform discharging to the pull-down points $P_n$ and $K_n$, thereby achieving the potentials of $P_n$ and $K_n$ changing up and down with the variation of the first clock signal CK1 and the second clock signal CK2, providing alternating operations so as to reduce the influence of the eighth and ninth thin-film transistor and the twelfth and thirteenth thin-film transistor by stresses, extending the lifespan of the GOA circuit. Further, using low frequency or ultralow frequency signals to control the pull-down holding unit effectively reduces power consumption of the circuit.

For better understanding of the features and technical contents of the present invention, reference will be made to the following detailed description of the present invention and the attached drawings. However, the drawings are provided for the purposes of reference and illustration and are not intended to impose limitations to the present invention.

BRIEF DESCRIPTION OF THE DRAWINGS

The technical solution, as well as other beneficial advantages, of the present invention will be apparent from the following detailed description of embodiments of the present invention, with reference to the attached drawing. In the drawing.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
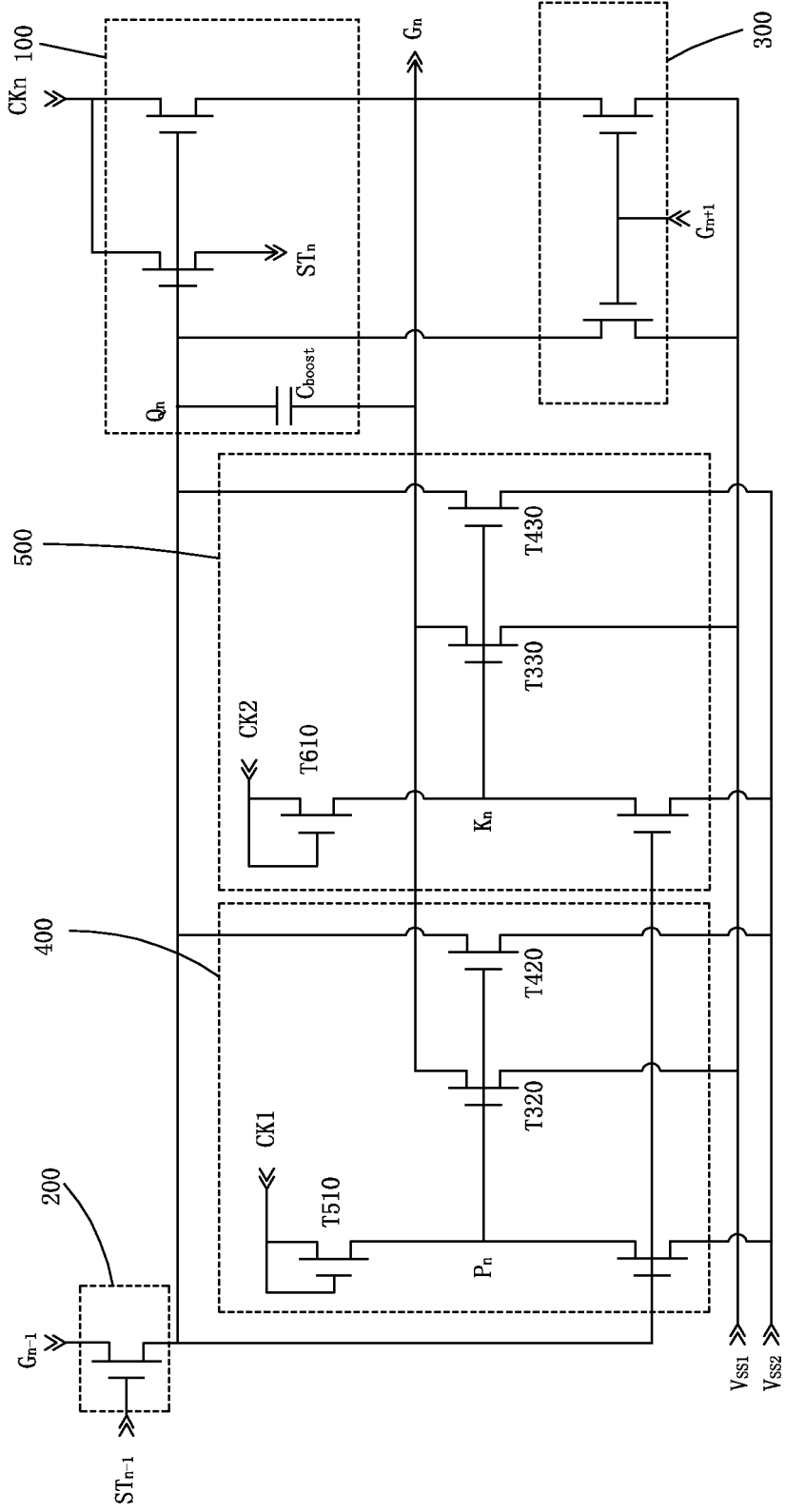
FIG. 1 is a circuit diagram of a conventional GOA (Gate Driver on Array) circuit.
Figure 2:
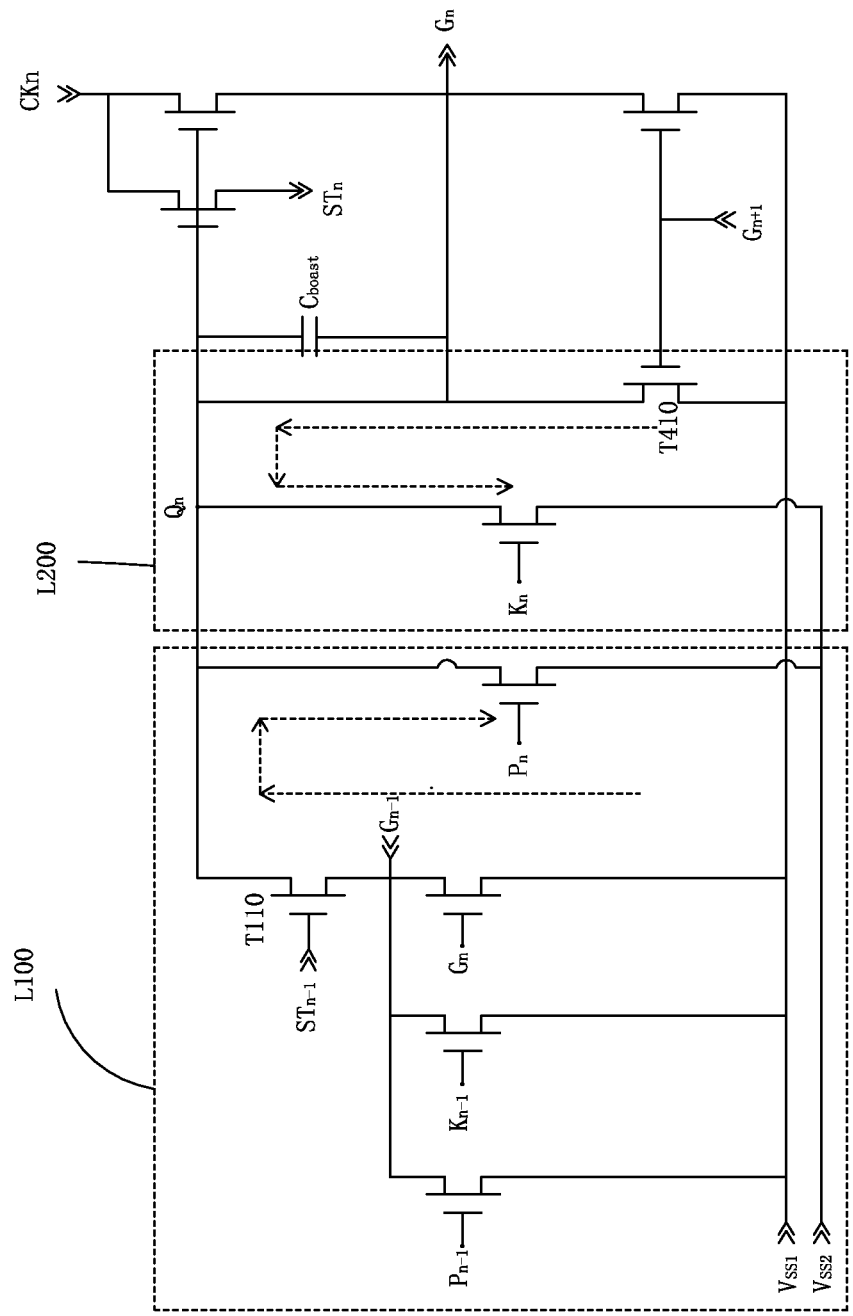
FIG. 2 is an equivalent circuit of FIG. 1.
Figure 3:
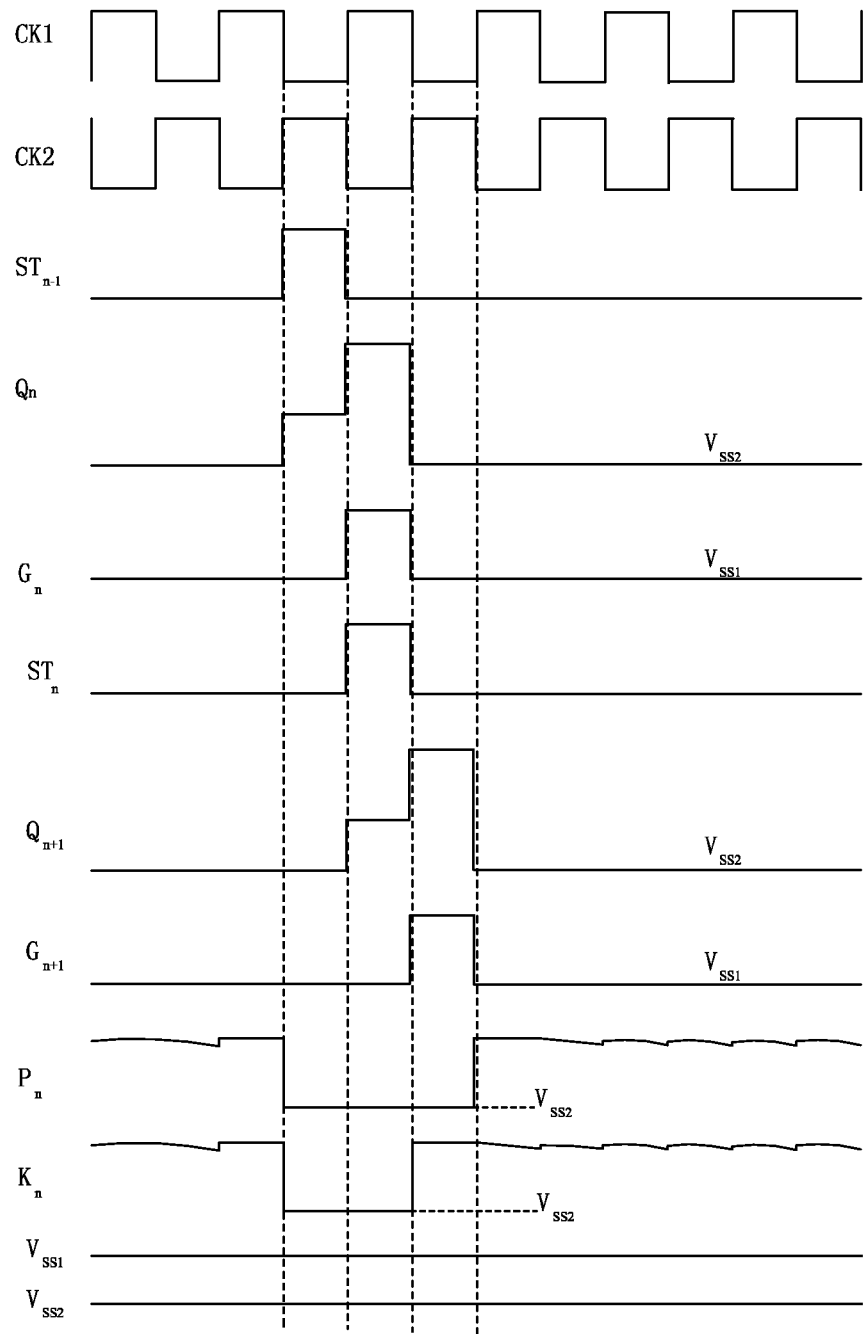
FIG. 3 is a drive timing diagram of the GOA circuit shown in FIG. 1.
Figure 4:
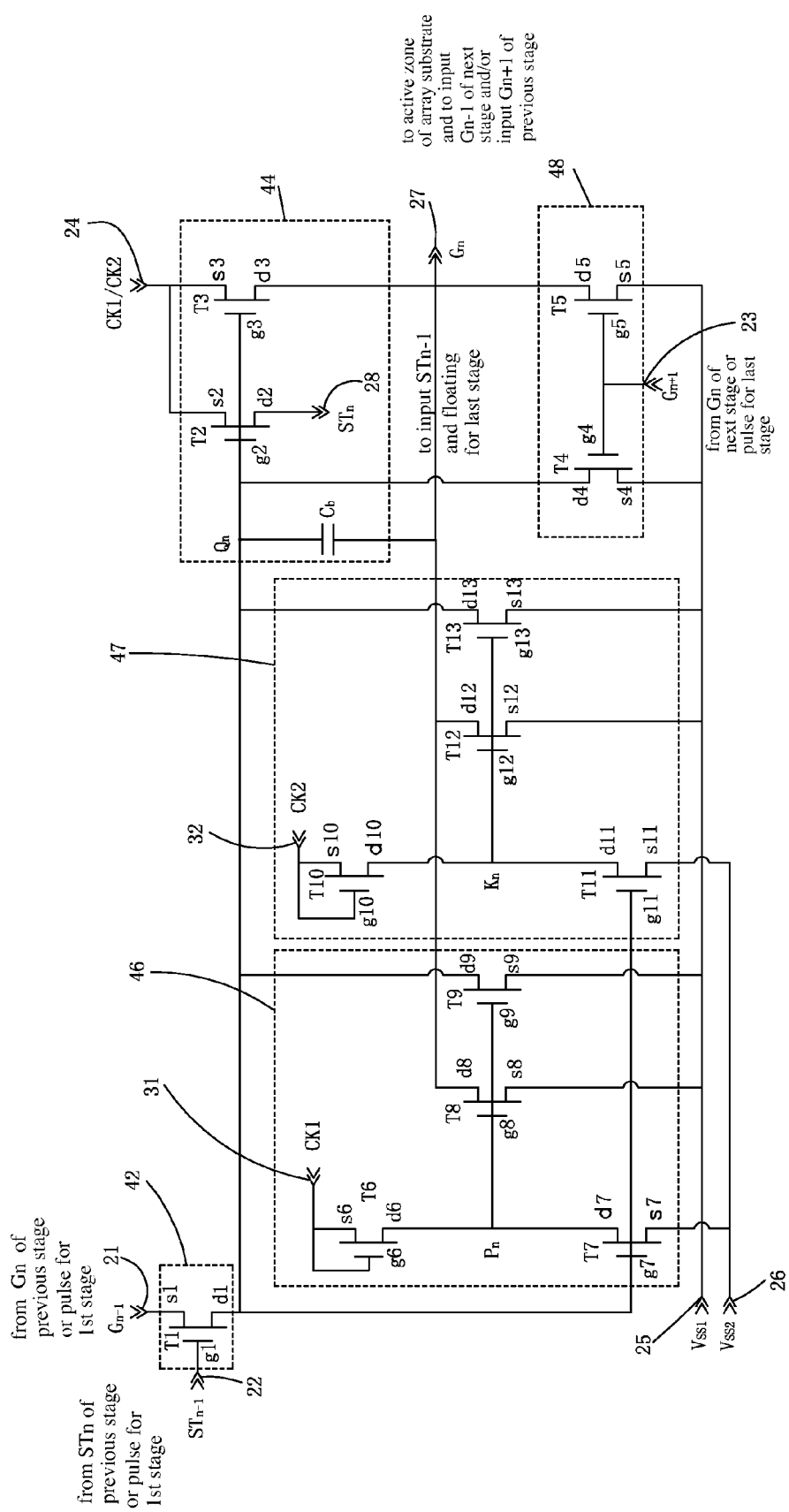
FIG. 4 is a circuit diagram of a GOA circuit according to a preferred embodiment of the present invention.
Figure 5:
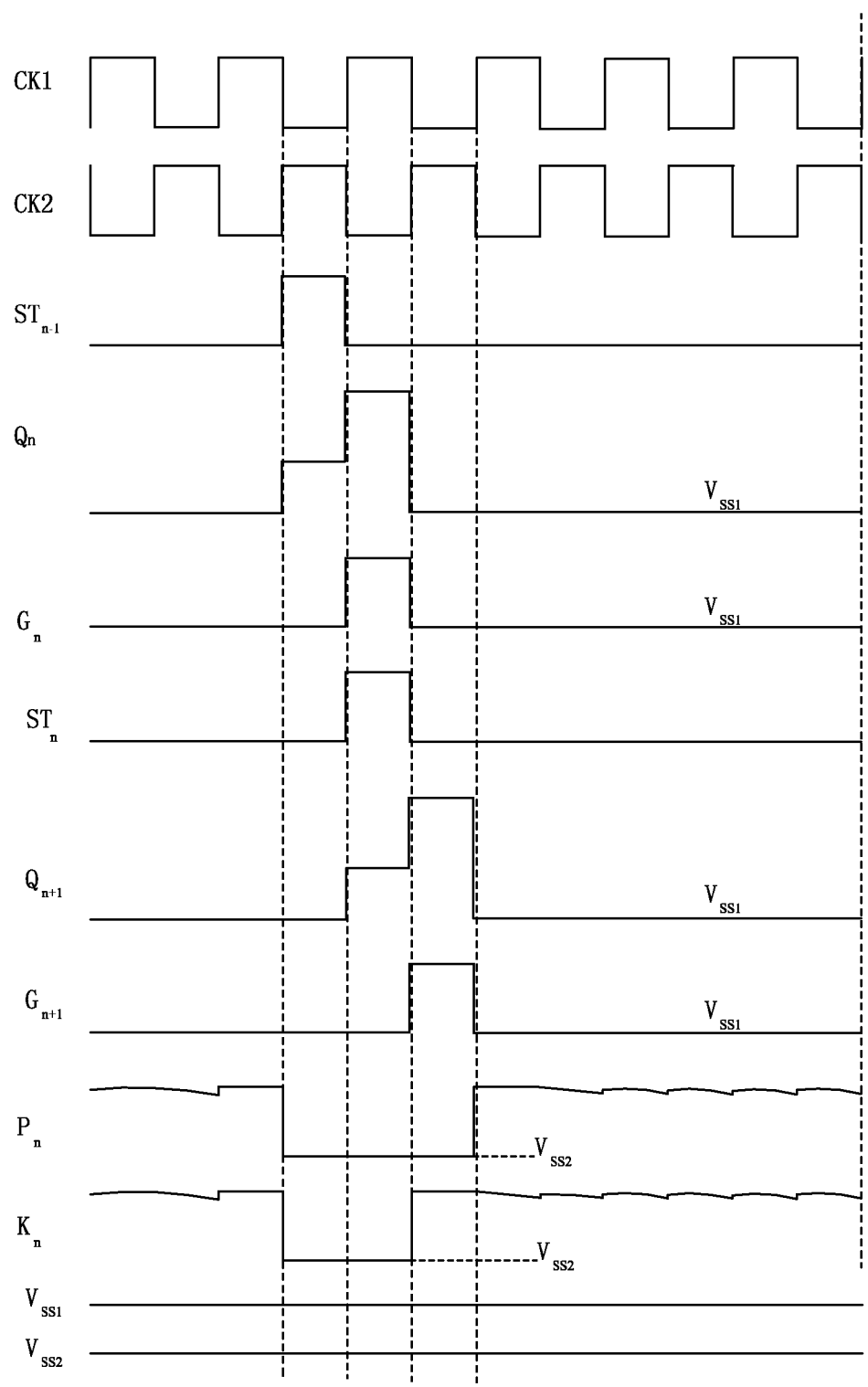
FIG. 5 is a drive timing diagram of the GOA circuit shown in FIG. 4.
Figure 6:
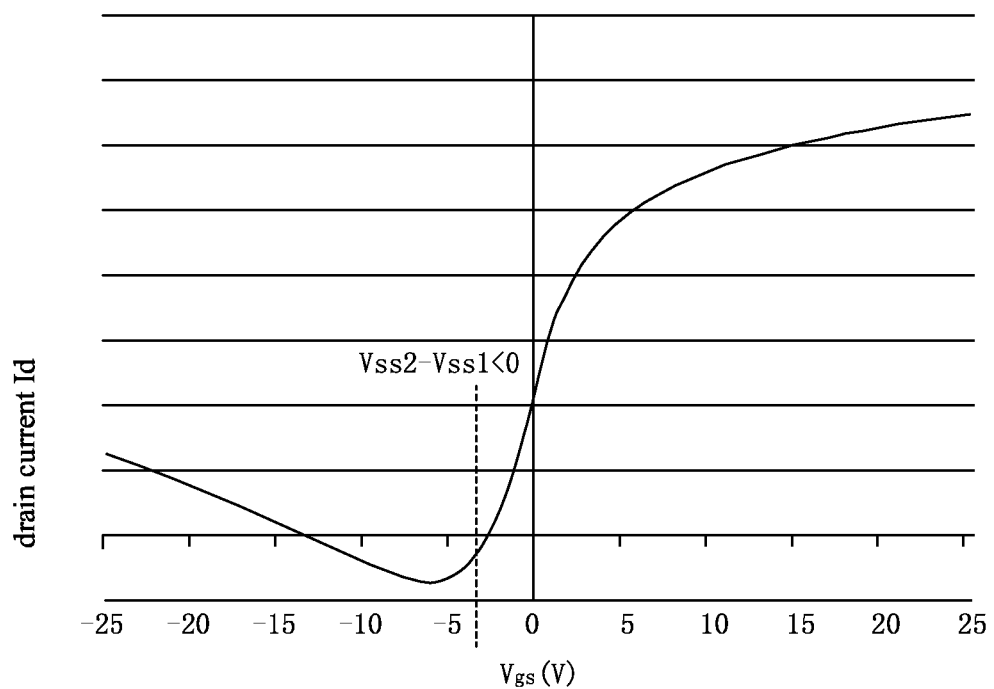
FIG. 6 is plot of a characteristic I-V curve of a thin-film transistor.

Referring to FIGS. 4-6, the present invention provides a GOA (Gate-Driver-on-Array) circuit, which comprises multiple stages of GOA units connected in cascade, wherein:

for each nth stage GOA unit between the second stage and the last second stage of the GOA circuit, the nth stage GOA unit comprises a first (n−1)th stage signal input terminal 21 ($G_{n-1}$), a second (n−1)th stage signal input terminal 22 ($ST_{n-1}$), a (n+1)th stage signal input terminal 23 ($G_{n+1}$), a first output terminal 27 ($G_n$), and a second output terminal 28 ($ST_n$), wherein the first output terminal 27 ($G_n$) of the nth stage GOA unit is provided for driving an active zone of an array substrate; the first (n−1)th stage signal input terminal 21 ($G_{n-1}$), the second (n−1)th stage signal input terminal 22 ($ST_{n-1}$), and the (n+1)th stage signal input terminal 23 ($G_{n+1}$) of the nth stage GOA unit are respectively and electrically connected to the first output terminal 27 ($G_n$) and the second output terminal 28 ($ST_n$) of the (n−1)th GOA unit and the first output terminal 27 ($G_n$) of the (n+1)th GOA unit, the first output terminal 27 ($G_n$) of the nth stage GOA unit being electrically connected to the first (n−1)th stage signal input terminal 21 ($G_{n-1}$) of the (n+1)th GOA unit and the (n+1)th stage signal input terminal 23 ($G_{n+1}$) of the (n−1)th GOA unit, the second output terminal 28 ($ST_n$) of the nth stage GOA unit being electrically connected to the second (n−1)th stage signal input terminal 22 ($ST_{n-1}$) of the (n+1)th GOA unit;

for the nth stage GOA unit at the first stage of the GOA circuit, the nth stage GOA unit comprises a first (n−1)th stage signal input terminal 21 ($G_{n-1}$), a second (n−1)th stage signal input terminal 22 ($ST_{n-1}$), a (n+1)th stage signal input terminal 23 ($G_{n+1}$), a first output terminal 27 ($G_n$), and a second output terminal 28 ($ST_n$), wherein the first output terminal 27 ($G_n$) of the nth stage GOA unit is provided for driving an active zone of an array substrate; the first (n−1)th stage signal input terminal 21 ($G_{n-1}$) and the second (n−1)th stage signal input terminal 22 ($ST_{n-1}$) of the nth stage GOA unit both provided for receiving an input of a pulse activation signal and the (n+1)th stage signal input terminal 23 ($G_{n+1}$) is electrically connected to the first output terminal 27 ($G_n$) of the (n+1)th GOA unit, the first output terminal 27 ($G_n$) and the second output terminal 28 ($ST_n$) of the nth stage GOA unit being respectively and electrically connected to the first (n−1)th stage signal input terminal 21 ($G_{n-1}$) and the second (n−1)th stage signal input terminal 22 ($ST_{n-1}$) of the (n+1)th GOA unit;

for the nth stage GOA unit at the last stage of the GOA circuit, the nth stage GOA unit comprises a first (n−1)th stage signal input terminal 21 ($G_{n-1}$), a second (n−1)th stage signal input terminal 22 ($ST_{n-1}$), a (n+1)th stage signal input terminal 23 ($G_{n+1}$), a first output terminal 27 ($G_n$), and a second output terminal 28 ($ST_n$); the first (n−1)th stage signal input terminal 21 ($G_{n-1}$) and the second input terminal 22 ($ST_{n-1}$) of the nth stage GOA unit are respectively and electrically connected to the first output terminal 27 ($G_n$) and the second output terminal 28 ($ST_n$) of the (n−1)th GOA unit, the (n+1)th stage signal input terminal 23 ($G_{n+1}$) of the nth stage GOA unit being provided to receive an input of a pulse activation signal, the first output terminal 27 ($G_n$) of the nth stage GOA unit being electrically connected to the (n+1)th stage signal input terminal 23 ($G_{n+1}$) of the (n−1)th GOA unit and the second output terminal 28 ($ST_n$) being open;

for each nth stage GOA unit between the first stage and the last stage of the GOA circuit, the nth stage GOA unit further comprises a first clock signal input terminal 24, a first low level input terminal 25, and a second low level input terminal 26, the first low level input terminal 25 being provided for receiving an input of a first low level $V_{ss1}$, the second low level input terminal 26 being provided for receiving an input of a second low level $V_{ss2}$, the second low level $V_{ss2}$ being smaller than the first low level $V_{ss1}$;

for each nth stage GOA unit between the first stage and the last stage of the GOA circuit, the nth stage GOA unit further comprises:

a pull-up control unit 42, which is electrically connected to the first (n−1)th stage signal input terminal 21 and the second (n−1)th stage signal input terminal 22;

a pull-up unit 44, which is electrically connected to the pull-up control unit 42 and the first clock signal input terminal 24, the first output terminal 27, and the second output terminal 28;

a first pull-down holding unit 46, which is electrically connected to the first low level input terminal 25, the second low level input terminal 26, the pull-up control unit 42, and the pull-up unit 44;

a second pull-down holding unit 47, which is electrically connected to the first low level input terminal 25, the second low level input terminal 26, the first pull-down holding unit 46, the pull-up control unit 42, and the pull-up unit 44; and a pull-down unit 48, which is electrically connected to the (n+1)th stage signal input terminal 23, the first low level input terminal 25, the pull-up control unit 42, the pull-up unit 44, the first pull-down holding unit 46, the second pull-down holding unit 47, and the first output terminal 27.

In the instant embodiment, the nth stage GOA unit of the GOA circuit further comprises a second clock signal input terminal 31 and a third clock signal input terminal 32. The first clock signal input terminal 24 has an input signal that is a first clock signal CK1 or a second clock signal CK2, the second clock signal input terminal 31 having an input signal that is the first clock signal CK1, the third clock signal input terminal 32 having an input signal that is the second clock signal CK2, the first clock signal CK1 being opposite in phase to the second clock signal CK2, meaning high and low voltages of the signals CK1 and CK2 being opposite to each other at a given time point; when the input signal of the first clock signal input terminal 24 of the nth stage GOA unit of the GOA circuit is the first clock signal CK1, the input signal of the first clock signal input terminal 24 of the (n+1)th stage GOA unit of the GOA circuit is the second clock signal CK2.

The pull-up control unit 42 is a first thin-film transistor T1 and the first thin-film transistor T1 comprises a first gate terminal g1, a first source terminal s1, and a first drain terminal d1, wherein the first gate terminal g1 is electrically connected to the second (n−1)th stage signal input terminal 22; the first source terminal s1 is electrically connected to the first (n−1)th stage signal input terminal 21; and the first drain terminal d1 is electrically connected to the first and second pull-down holding units 46, 47, the pull-down unit 48, and the pull-up unit 44.

The pull-up unit 44 comprises a capacitor $C_b$, a second thin-film transistor T2, and a third thin-film transistor T3 and the second thin-film transistor T2 comprises a second gate terminal g2, a second source terminal s2, and a second drain terminal d2 and the third thin-film transistor T3 comprises a third gate terminal g3, a third source terminal s3, and a third drain terminal d3, wherein the second gate terminal g2 is electrically connected to one end of the capacitor $C_b$, the first drain terminal d1, the third gate terminal g3, the first and second pull-down holding units 46, 47, and the pull-down unit 48; the second source terminal s2 is electrically connected to the third source terminal s3 and the first clock signal input terminal 24; the second drain terminal d2 is electrically connected to the second output terminal 28; and the third drain terminal d3 is electrically connected to the first output terminal 27, the first and second pull-down holding units 46, 47, the pull-down unit 48, and an opposite end of the capacitor $C_b$.

The pull-down unit 48 comprises fourth and fifth thin-film transistors T4, T5 and the fourth thin-film transistor T4 comprises a fourth gate terminal g4, a fourth source terminal s4, and a fourth drain terminal d4 and the fifth thin-film transistor T5 comprises a fifth gate terminal g5, a fifth source terminal s5, and a fifth drain terminal d5, wherein the fourth gate terminal g4 is electrically connected to the fifth gate terminal g5 and the (n+1)th stage signal input terminal 23; the fourth source terminal s4 is electrically connected to a first low level input terminal and the fifth source terminal s5; the fourth drain terminal d4 is electrically connected to the first drain terminal d1, said one end of the capacitor $C_b$, the second gate terminal g2, the third gate terminal g3, and the first and second pull-down holding units 46, 47; and the fifth drain terminal d5 is electrically connected to the first output terminal 27, the third source terminal s3, said opposite end of the capacitor $C_b$, and the first and second pull-down holding units 46, 47.

The first pull-down holding unit 46 comprises sixth to ninth thin-film transistors T6, T7, T8, T9 and the sixth thin-film transistor T6 comprises a sixth gate terminal g6, a sixth source terminal s6, and a sixth drain terminal d6; the seventh thin-film transistor T7 comprises a seventh gate terminal g7, a seventh source terminal s7, and a seventh drain terminal d7; the eighth thin-film transistor comprises an eighth gate terminal g8, an eighth source terminal s8, and an eighth drain terminal d8; and the ninth thin-film transistor comprises a ninth gate terminal g9, a ninth source terminal s9, and a ninth drain terminal d9, wherein the sixth gate terminal g6 and the sixth source terminal s6 are connected to the second clock signal input terminal 31; the sixth drain terminal d6 is electrically connected to a pull-down point $P_n$, the seventh drain terminal d7, the eighth gate terminal g8, and the ninth gate terminal g9; the seventh gate terminal g7 is electrically connected to the first drain terminal d1, the ninth drain terminal d9, said one end of the capacitor $C_b$, the second gate terminal g2, the third gate terminal g3, the fourth drain terminal d4, and the second pull-down holding unit 47; the seventh source terminal s7 is electrically connected to a second low level input terminal 26; the eighth drain terminal d8 is electrically connected to said opposite end of the capacitor $C_b$, the second pull-down holding unit 47, and the first output terminal 27 ($G_n$); the eighth source terminal s8 is electrically connected to the first low level input terminal 25; and the ninth source terminal s9 is electrically connected to the first low level input terminal 25.

The eighth thin-film transistor T8 is provided generally for maintaining a low voltage of the first output terminal 27 ($G_n$); the ninth thin-film transistor T9 is provided for maintaining a low voltage of the pull-down point $Q_n$; the seventh thin-film transistor T7 is provided for setting pull-down points $P_n$ and $K_n$ at low voltages when $Q_n$ is at a high voltage and also for deactivating the first pull-down holding unit 46 to prevent the pull-down point $Q_n$ from affecting the first output terminal 27 ($G_n$). The second low level $V_{ss2}$ being smaller than the first low level $V_{ss1}$ helps reduce leakage currents of the eighth and ninth thin-film transistors T8, T9.

The second pull-down holding unit 47 comprises tenth to thirteenth thin-film transistors T10, T11, T12, T13 and the tenth thin-film transistor T10 comprises a tenth gate terminal g10, a tenth source terminal s10, and a tenth drain terminal d10; the eleventh thin-film transistor T11 comprises an eleventh gate terminal g11, an eleventh source terminal s11, and an eleventh drain terminal d11; the twelfth thin-film transistor T12 comprises a twelfth gate terminal g12, a twelfth source terminal s12, and a twelfth drain terminal d12; and the thirteenth thin-film transistor T13 comprises a thirteenth gate terminal g13, a thirteenth source terminal s13, and a thirteenth drain terminal d13, wherein the tenth gate terminal g10 and the tenth source terminal s10 are connected to the third clock signal input terminal 32; the tenth drain terminal d10 is electrically connected to a pull-down point $K_n$, the eleventh drain terminal d11, the twelfth gate terminal g12, and the thirteenth gate terminal g13; the eleventh gate terminal g11 is electrically connected to the first drain terminal d1, the thirteenth drain terminal d13, the seventh gate terminal g7, the ninth drain terminal d9, and said one end of the capacitor $C_b$; the eleventh source terminal s11 is electrically connected to the second low level input terminal 26; the twelfth drain terminal d12 is electrically connected to said opposite end of the capacitor $C_b$, the eighth drain terminal d8, and the first output terminal 27 ($G_n$); the twelfth source terminal s12 is electrically connected to the first low level input terminal 25; and the thirteenth source terminal s13 is electrically connected to the first low level input terminal.

The twelfth thin-film transistor T12 is provided generally for maintain a low voltage of the first output terminal 27 ($G_n$); the thirteenth thin-film transistor T13 is provided for maintain a low voltage of the pull-down point $Q_n$; the eleventh thin-film transistor T11 is provided for setting the pull-down points $P_n$ and $K_n$ at a low voltage when $Q_n$ is at a high voltage and for deactivating the second pull-down holding unit 47 to prevent the pull-down point $Q_n$ from affecting the first output terminal 27 ($G_n$). The second low level $V_{ss2}$ being smaller than the first low level $V_{ss1}$ helps reduce leakage currents of the twelfth and thirteenth thin-film transistors T12, T13.

Referring to FIG. 5, in the drawing, signals CK1 and CK2 are two clock signals of which the low voltages are opposite at a give time point; the second low level $V_{ss2}$ is smaller than the first low level $V_{ss1}$; and $G_n$ and $G_{n+1}$ are the output signals of the second output terminals 27 of two adjacent GOA units. It can be seen that $Q_n$ and $G_n$ can be pulled down to the low voltage of $V_{ss1}$ and $P_n$ and $K_n$ can be pulled to the low voltage of $V_{ss2}$ when $Q_n$ and $G_n$ are at the high voltage. In this way, the relative potential $V_{gs}$ between the gate terminal and the source terminal of the eighth and ninth thin-film transistors T8, T9 and between those of the twelfth and thirteenth thin-film transistors T12, T13 is less than 0 ($V_{gs}=V_{ss2}-V_{ss1}$). Since the minimum leakage current of a thin-film transistor in an OFF state is at a location where the relative potential $V_{gs}$ between the gate terminal and the source terminal is less than 0 (as shown in FIG. 6), the GOA circuit of the instant embodiment can effectively reduce the leakage currents of the eighth and ninth thin-film transistors T8, T9 and the twelfth and thirteenth thin-film transistors T12, T13.

Figure 7:
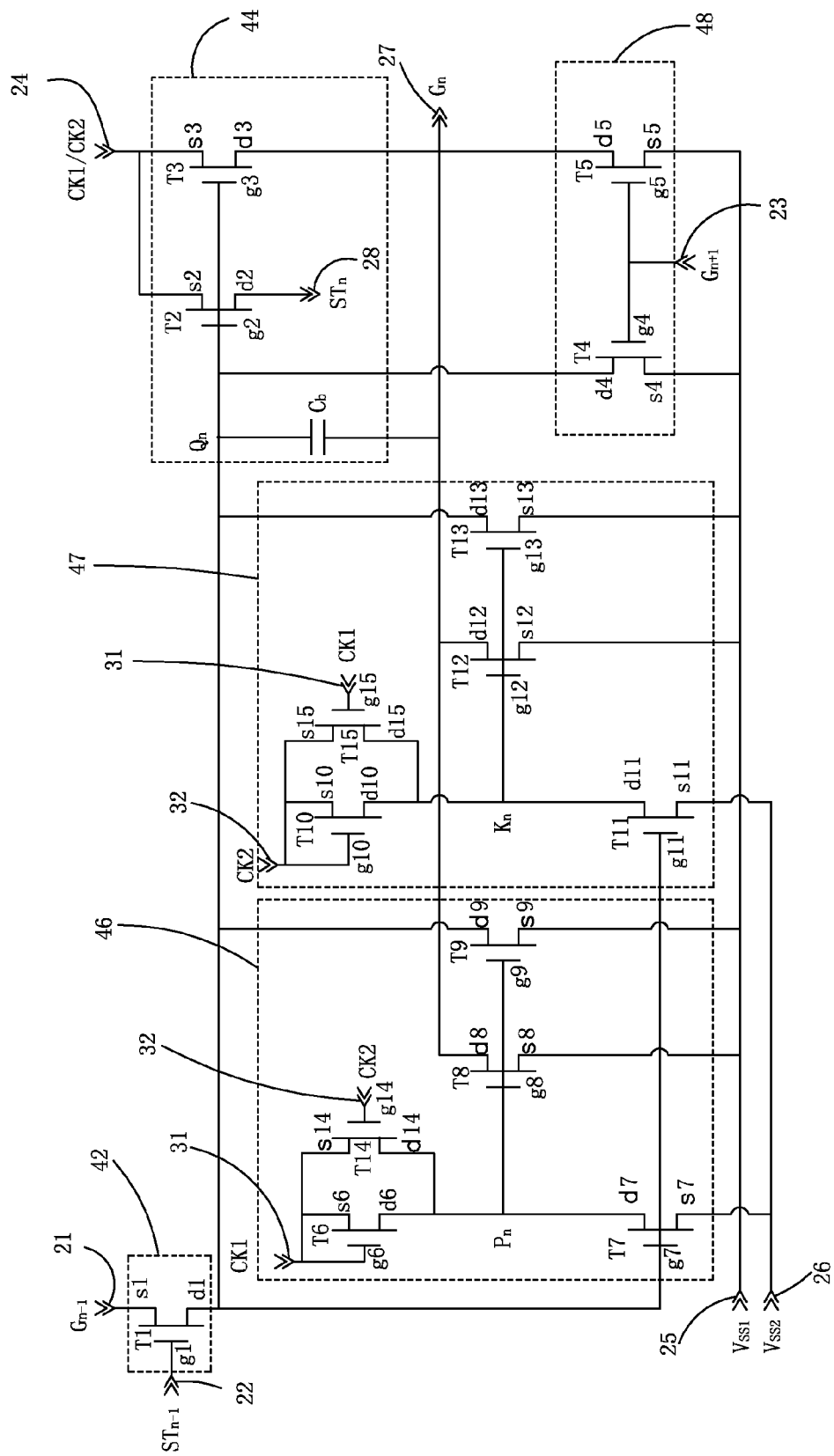
FIG. 7 is a circuit diagram of a GOA circuit according to another preferred embodiment of the present invention.
Figure 8:
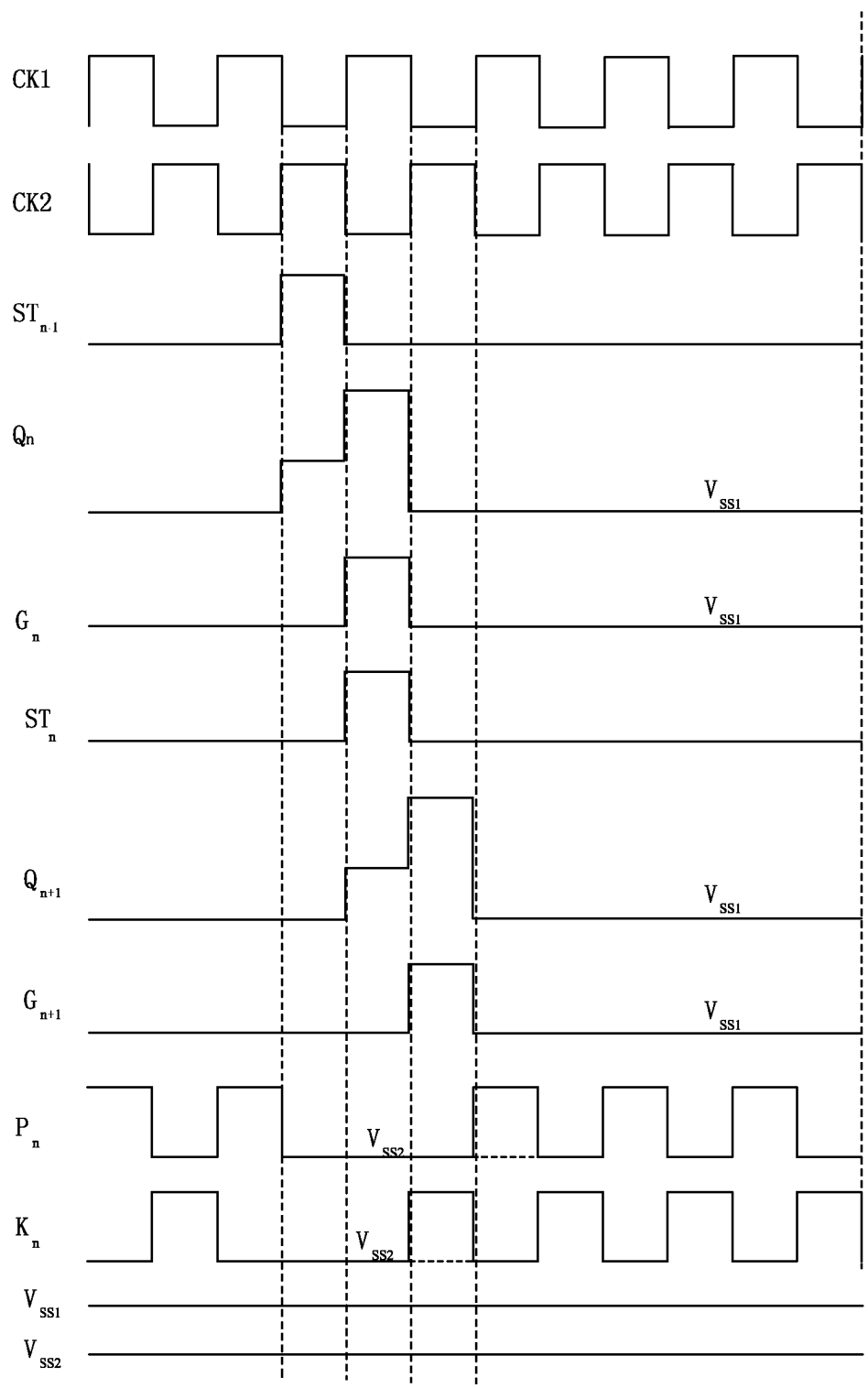
FIG. 8 is a drive timing diagram of the GOA circuit shown in FIG. 7

Referring to FIGS. 7-8, which shows a GOA circuit according to another embodiment of the present invention provides, in the instant embodiment, the first pull-down holding unit 46 further comprises a fourteenth thin-film transistor T14 and the fourteenth thin-film transistor T14 comprises a fourteenth gate terminal g14, a fourteenth source terminal s14, and a fourteenth drain terminal d14, wherein the fourteenth gate terminal g14 is connected to the third clock signal input terminal 32; the fourteenth drain terminal d14 is electrically connected to the sixth drain terminal d6, the seventh drain terminal d7, the eighth gate terminal g8, and the ninth gate terminal g9; and the fourteenth source terminal s14 is electrically connected to the sixth gate terminal g6, the sixth source terminal g6, and the second clock signal input terminal 31. The second pull-down holding unit 47 further comprises a fifteenth thin-film transistor T15 and the fifteenth thin-film transistor T15 comprises a fifteenth gate terminal g15, a fifteenth source terminal s15, and a fifteenth drain terminal d15, wherein the fifteenth gate terminal g15 is connected to the second clock signal input terminal 31; the fifteenth source terminal s15 is electrically connected to the tenth source terminal s10, the tenth gate terminal g10, and the third clock signal input terminal 32; and the fifteenth drain terminal d15 is electrically connected to the tenth drain terminal d10, the eleventh drain terminal d11, the twelfth gate terminal g12, and the thirteenth gate terminal g13.

In the instant embodiment, the first and second pull-down holding units 46, 47 are improved in respect of the drawback of the diode design of the sixth thin-film transistor T6 and the tenth thin-film transistor T10 by additionally including the fourteenth thin-film transistor T14 and the fifteenth thin-film transistor T15 to discharge to the pull-down points $P_n$ and $K_n$ in order to fast pull the potentials of the pull-down points $P_n$ and $K_n$ down to the low voltage of the first clock signal CK1 or the second clock signal CK2 的 the low voltage. Through the alternative operations of the first and second pull-down holding units 46, 47, the potentials of $P_n$ and $K_n$ following variations of the first clock signal CK1 and the second clock signal CK2 to change up and down can be achieved, providing alternating operations thereby reducing the influence of the eighth and ninth thin-film transistors T8, T9 and the twelfth and thirteenth thin-film transistor sT12, T13 by stress.

Figure 9:
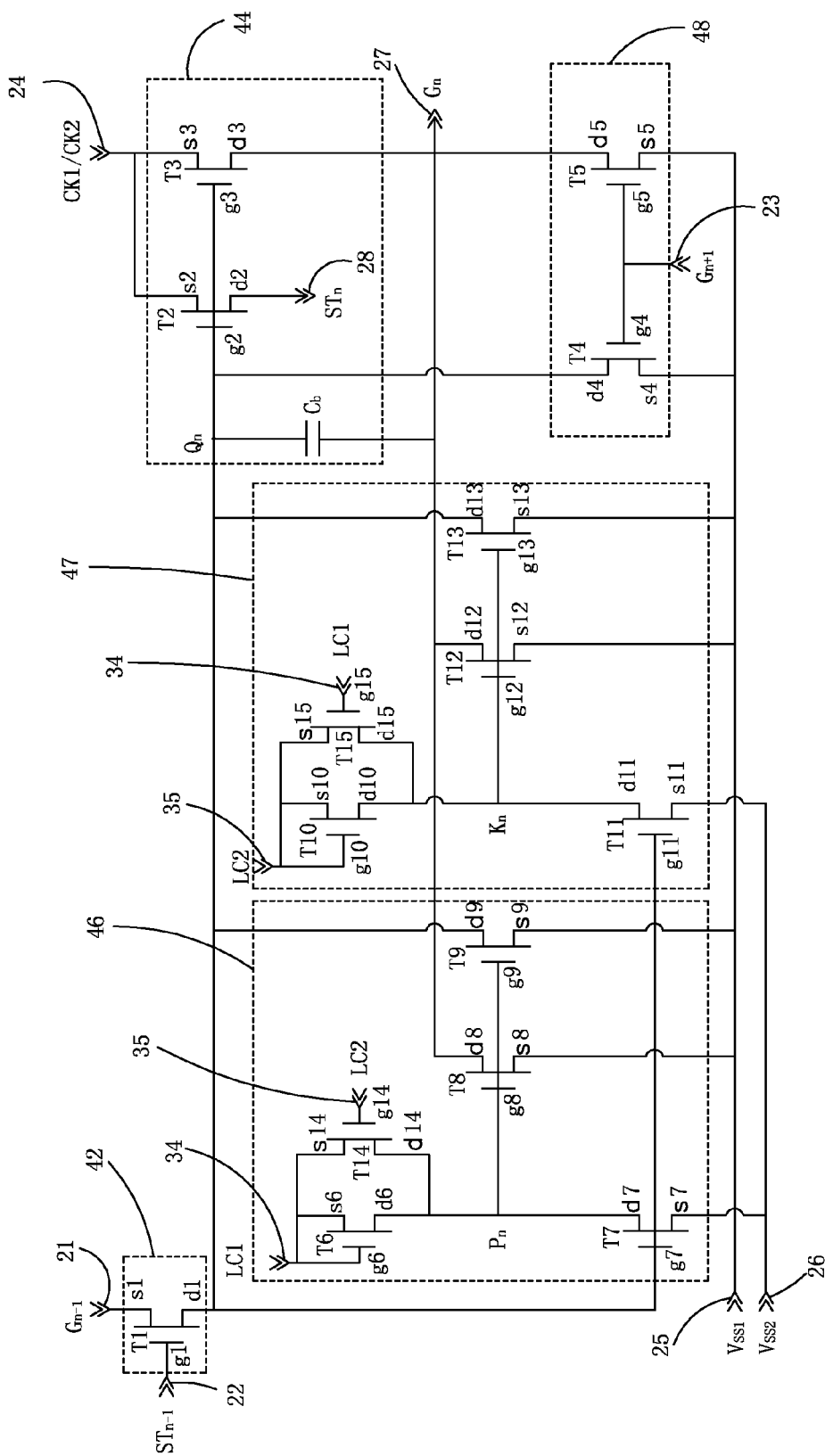
FIG. 9 is a circuit diagram of a GOA circuit according to a further preferred embodiment of the present invention.
Figure 10:
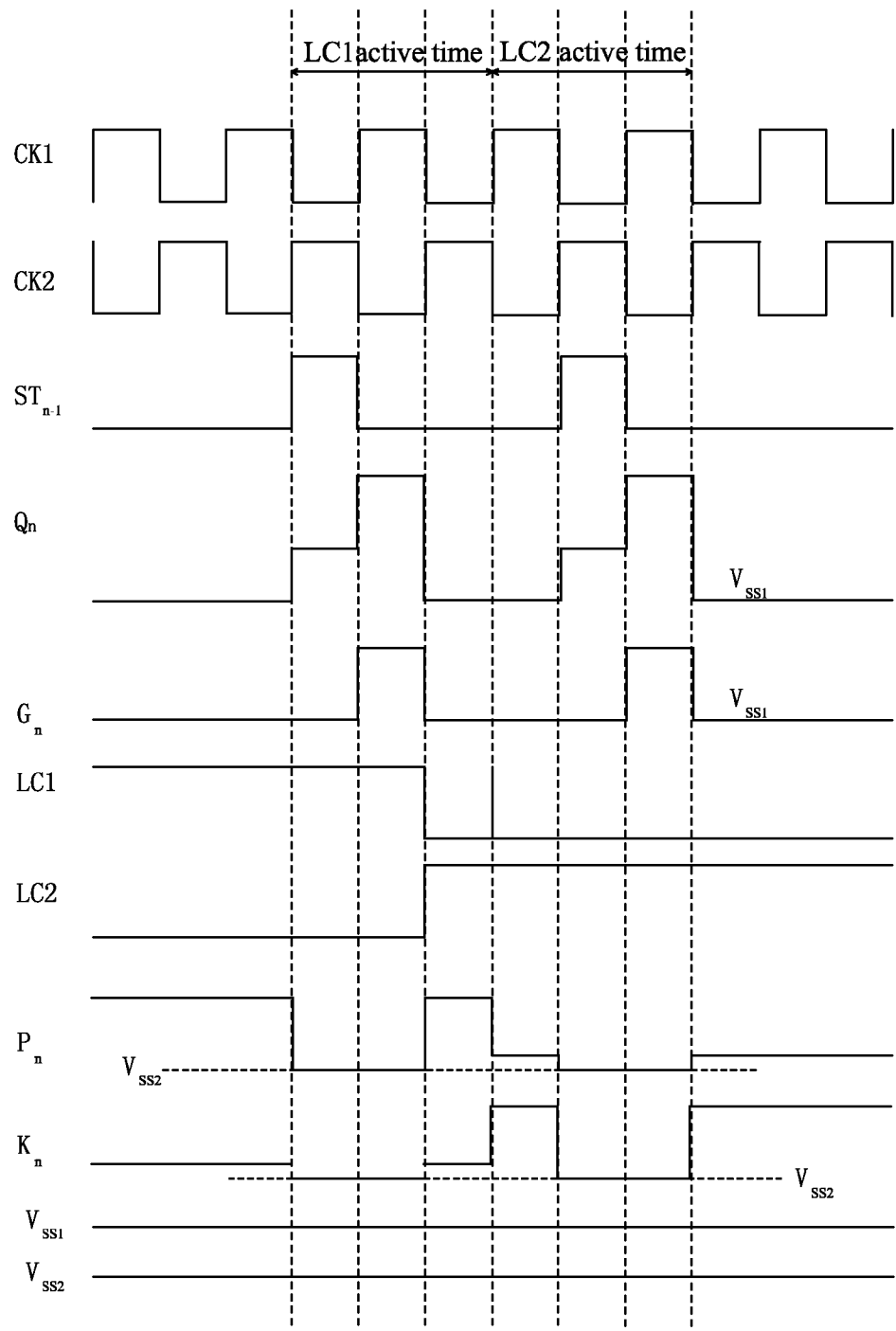
FIG. 10 is a drive timing diagram of the GOA circuit shown in FIG. 9.

Referring to FIGS. 9-10, which show a GOA circuit according to a further embodiment of the present invention, the instant embodiment is generally similar to the embodiment with reference to FIG. 7 and a difference therebetween is that in the instant embodiment, the second and third clock signal input terminals 31, 32 of the first and second pull-down holding units 46, 47 are replaced by first and second low frequency signal input terminals 34, 35 and the first and second low frequency signal input terminals 34, 35 receive inputs of low frequency or ultralow frequency signals LC1 and LC2. This helps reduce power consumptions of the first and second pull-down holding units 46, 47, because the first and second pull-down holding units 46, 47 are constantly kept in operating conditions and for a large number of stages included in the GOA circuit, high frequency signals would increase the power consumption of the GOA circuit.

In summary, the present invention provides a GOA circuit, which uses two low level signals to reduce the leakage currents of the thin-film transistors of a pull-down holding unit, wherein the second low level that has a lower level provides a low voltage to pull-down points $P_n$ and $K_n$ and the first low level that has a higher level provides a low voltage to the pull-down points $Q_n$ and $G_n$, so as to reduce the potentials of the pull-down point $P_n$ and $K_n$ when the pull-down point $Q_n$ and $G_n$ are activated to thereby facilitate charging of $Q_n$ and $G_n$ and also to break the leakage current loop of the circuit between two low level signals to greatly reduce the leakage current between the two low level signal, enhance the performance of the GOA circuit, and improve the quality of displayed images; further, the fourteenth thin-film transistor and the fifteenth thin-film transistor are additionally included in respect of the diode design of the sixth thin-film transistor and the tenth thin-film transistor to perform discharging to the pull-down points $P_n$ and $K_n$, thereby achieving the potentials of $P_n$ and $K_n$ changing up and down with the variation of the first clock signal CK1 and the second clock signal CK2, providing alternating operations so as to reduce the influence of the eighth and ninth thin-film transistor and the twelfth and thirteenth thin-film transistor by stresses, extending the lifespan of the GOA circuit. Further, using low frequency or ultralow frequency signals to control the pull-down holding unit effectively reduces power consumption of the circuit.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A GOA (Gate-Driver-on-Array) circuit, comprising multiple stages of GOA units connected in cascade, wherein:

for each nth stage GOA unit between the second stage and the last second stage of the GOA circuit, the nth stage GOA unit comprises a first (n−1)th stage signal input terminal, a second (n−1)th stage signal input terminal, a (n+1)th stage signal input terminal, a first output terminal, and a second output terminal, wherein the first output terminal of the nth stage GOA unit is provided for driving an active zone of an array substrate; the first (n−1)th stage signal input terminal, the second (n−1)th stage signal input terminal, and the (n+1)th stage signal input terminal of the nth stage GOA unit are respectively and electrically connected to the first output terminal and the second output terminal of the (n−1)th GOA unit and the first output terminal of the (n+1)th GOA unit, the first output terminal of the nth stage GOA unit being electrically connected to the first (n−1)th stage signal input terminal of the (n+1)th GOA unit and the (n+1)th stage signal input terminal of the (n−1)th GOA unit, the second output terminal of the nth stage GOA unit being electrically connected to the second (n−1)th stage signal input terminal of the (n+1)th GOA unit;

for the nth stage GOA unit at the first stage of the GOA circuit, the nth stage GOA unit comprises a first (n−1)th stage signal input terminal, a second (n−1)th stage signal input terminal, a (n+1)th stage signal input terminal, a first output terminal, and a second output terminal, wherein the first output terminal of the nth stage GOA unit is provided for driving an active zone of an array substrate; the first (n−1)th stage signal input terminal and the second (n−1)th stage signal input terminal of the nth stage GOA unit both provided for receiving an input of a pulse activation signal and the (n+1)th stage signal input terminal is electrically connected to the first output terminal of the (n+1)th GOA unit, the first output terminal and the second output terminal of the nth stage GOA unit being respectively and electrically connected to the first (n−1)th stage signal input terminal and the second (n−1)th stage signal input terminal of the (n+1)th GOA unit;

for the nth stage GOA unit at the last stage of the GOA circuit, the nth stage GOA unit comprises a first (n−1)th stage signal input terminal, a second (n−1)th stage signal input terminal, a (n+1)th stage signal input terminal, a first output terminal, and a second output terminal; the first (n−1)th stage signal input terminal and a second input terminal of the nth stage GOA unit are respectively and electrically connected to the first output terminal and the second output terminal of the (n−1)th GOA unit, the (n+1)th stage signal input terminal of the nth stage GOA unit being provided to receive an input of a pulse activation signal, the first output terminal of the nth stage GOA unit being electrically connected to the (n+1)th stage signal input terminal of the (n−1)th GOA unit and the second output terminal being open;

for each nth stage GOA unit between the first stage and the last stage of the GOA circuit, the nth stage GOA unit further comprises a first clock signal input terminal, a first low level input terminal, and a second low level input terminal, the first low level input terminal being provided for receiving an input of a first low level, the second low level input terminal being provided for receiving an input of a second low level, the second low level being smaller than the first low level;

for each nth stage GOA unit between the first stage and the last stage of the GOA circuit, the nth stage GOA unit further comprises:

a pull-up control unit, which is electrically connected to the first (n−1)th stage signal input terminal and the second (n−1)th stage signal input terminal;

a pull-up unit, which is electrically connected to the pull-up control unit and the first clock signal input terminal, the first output terminal, and the second output terminal;

a first pull-down holding unit, which is electrically connected to the first low level input terminal, the second low level input terminal, the pull-up control unit, and the pull-up unit;

a second pull-down holding unit, which is electrically connected to the first low level input terminal, the second low level input terminal, the first pull-down holding unit, the pull-up control unit, and the pull-up unit; and a pull-down unit, which is electrically connected to the (n+1)th stage signal input terminal, the first low level input terminal, the pull-up control unit, the pull-up unit, the first pull-down holding unit, the second pull-down holding unit, and the first output terminal;

wherein the pull-up control unit is a first thin-film transistor and the first thin-film transistor comprises a first gate terminal, a first source terminal, and a first drain terminal, wherein the first gate terminal is electrically connected to the second (n −1)th stage signal input terminal; the first source terminal is electrically connected to the first (n −1)th stage signal input terminal; and the first drain terminal is electrically connected to the first and second pull-down holding units, the pull-down unit, and the pull-up unit; and wherein the pull-up unit comprises a capacitor, a second thin-film transistor, and a third thin-film transistor and the second thin-film transistor comprises a second gate terminal, a second source terminal, and a second drain terminal and the third thin-film transistor comprises a third gate terminal, a third source terminal, and a third drain terminal, wherein the second gate terminal is electrically connected to one end of the capacitor, the first drain terminal, the third gate terminal, the first and second pull-down holding units, and the pull-down unit; the second source terminal is electrically connected to the third source terminal and the first clock signal input terminal; the second drain terminal is electrically connected to the second output terminal; and the third drain terminal is electrically connected to the first output terminal, the first and second pull-down holding units, the pull-down unit, and an opposite end of the capacitor.

2. The GOA circuit as claimed in claim 1, wherein the first clock signal input terminal has an input signal that is a first clock signal or a second clock signal, the first clock signal being opposite in phase to the second clock signal; when the input signal of the first clock signal input terminal of the nth stage GOA unit of the GOA circuit is the first clock signal, the input signal of the first clock signal input terminal of the (n+1) th stage GOA unit of the GOA circuit is the second clock signal.

3. The GOA circuit as claimed in claim 1, wherein the pull-down unit comprises fourth and fifth thin-film transistors and the fourth thin-film transistor comprises a fourth gate terminal, a fourth source terminal, and a fourth drain terminal and the fifth thin-film transistor comprises a fifth gate terminal, a fifth source terminal, and a fifth drain terminal, wherein the fourth gate terminal is electrically connected to the fifth gate terminal and the (n+1)th stage signal input terminal; the fourth source terminal is electrically connected to a first low level input terminal and the fifth source terminal; the fourth drain terminal is electrically connected to the first drain terminal, said one end of the capacitor, the second gate terminal, the third gate terminal, and the first and second pull-down holding units; and the fifth drain terminal is electrically connected to the first output terminal, the third source terminal, said opposite end of the capacitor, and the first and second pull-down holding units.

4. The GOA circuit as claimed in claim 3, wherein the first pull-down holding unit comprises sixth to ninth thin-film transistors and the sixth thin-film transistor comprises a sixth gate terminal, a sixth source terminal, and a sixth drain terminal; the seventh thin-film transistor comprises a seventh gate terminal, a seventh source terminal, and a seventh drain terminal; the eighth thin-film transistor comprises an eighth gate terminal, an eighth source terminal, and an eighth drain terminal; and the ninth thin-film transistor comprises a ninth gate terminal, a ninth source terminal, and a ninth drain terminal, wherein the sixth drain terminal is electrically connected to the seventh drain terminal, the eighth gate terminal, and the ninth gate terminal; the seventh gate terminal is electrically connected to the first drain terminal, the ninth drain terminal, said one end of the capacitor, the second gate terminal, the third gate terminal, the fourth drain terminal, and the second pull-down holding unit; the seventh source terminal is electrically connected to a second low level input terminal; the eighth drain terminal is electrically connected to said opposite end of the capacitor, the second pull-down holding unit, and the first output terminal; the eighth source terminal is electrically connected to the first low level input terminal; and the ninth source terminal is electrically connected to the first low level input terminal; and the second pull-down holding unit comprises tenth to thirteenth thin-film transistors and the tenth thin-film transistor comprises a tenth gate terminal, a tenth source terminal, and a tenth drain terminal; the eleventh thin-film transistor comprises an eleventh gate terminal, an eleventh source terminal, and an eleventh drain terminal; the twelfth thin-film transistor comprises a twelfth gate terminal, a twelfth source terminal, and a twelfth drain terminal; and the thirteenth thin-film transistor comprises a thirteenth gate terminal, a thirteenth source terminal, and a thirteenth drain terminal, wherein the tenth drain terminal is electrically connected to the eleventh drain terminal, the twelfth gate terminal, and the thirteenth gate terminal; the eleventh gate terminal is electrically connected to the first drain terminal, the thirteenth drain terminal, the seventh gate terminal, the ninth drain terminal, and said one end of the capacitor; the eleventh source terminal is electrically connected to the second low level input terminal; the twelfth drain terminal is electrically connected to said opposite end of the capacitor, the eighth drain terminal, and the first output terminal; the twelfth source terminal is electrically connected to the first low level input terminal; and the thirteenth source terminal is electrically connected to the first low level input terminal.

5. The GOA circuit as claimed in claim 4, wherein the nth stage GOA unit of the GOA circuit further comprises a second clock signal input terminal and a third clock signal input terminal, the sixth gate terminal and the sixth source terminal being connected to the second clock signal input terminal, the tenth gate terminal and the tenth source terminal being connected to the third clock signal input terminal, the second clock signal input terminal receiving an input of the first clock signal, the third clock signal input terminal receiving an input of the second clock signal.

6. The GOA circuit as claimed in claim 4, wherein the first pull-down holding unit further comprises a fourteenth thin-film transistor and the fourteenth thin-film transistor comprises a fourteenth gate terminal, a fourteenth source terminal, and a fourteenth drain terminal, wherein the fourteenth drain terminal is electrically connected to the sixth drain terminal, the seventh drain terminal, the eighth gate terminal, and the ninth gate terminal; and the fourteenth source terminal is electrically connected to the sixth gate terminal, the sixth source terminal, and the second clock signal input terminal; and the second pull-down holding unit further comprises a fifteenth thin-film transistor and the fifteenth thin-film transistor comprises a fifteenth gate terminal, a fifteenth source terminal, and a fifteenth drain terminal, wherein the fifteenth drain terminal is electrically connected to the tenth drain terminal, the eleventh drain terminal, the twelfth gate terminal, and the thirteenth gate terminal and the fifteenth source terminal is electrically connected to the tenth gate terminal and the tenth source terminal.

7. The GOA circuit as claimed in claim 6, wherein the nth stage GOA unit of the GOA circuit further comprises a second clock signal input terminal and a third clock signal input terminal; the sixth gate terminal, the sixth source terminal, and the fourteenth source terminal are connected to the second clock signal input terminal; the fourteenth gate terminal is connected to the third clock signal input terminal; the tenth gate terminal, the tenth source terminal, and the fifteenth source terminal are connected to the third clock signal input terminal; the fifteenth gate terminal is connected to the second clock signal input terminal; and the second clock signal input terminal receives an input of the first clock signal and the third clock signal input terminal receives an input of the second clock signal.

8. The GOA circuit as claimed in claim 6, wherein the nth stage GOA unit of the GOA circuit further comprises a first low frequency signal input terminal and a second low frequency input terminal, the sixth gate terminal; the sixth source terminal and the fourteenth source terminal are connected to the first low frequency signal input terminal; the fourteenth gate terminal is connected to the second low frequency signal input terminal; the tenth gate terminal, the tenth source terminal, and the fifteenth source terminal are connected to the second low frequency signal input terminal; the fifteenth gate terminal is connected to the first low frequency signal input terminal; and the first low frequency signal input terminal receives an input of a low frequency signal or an ultralow frequency signal and the second low frequency signal input terminal receives an input of a low frequency signal or an ultralow frequency signal.

9. A GOA (Gate-Driver-on-Array) circuit, comprising multiple stages of GOA units connected in cascade, wherein:
for each nth stage GOA unit between the second stage and the last second stage of the GOA circuit, the nth stage GOA unit comprises a first (n −1)th stage signal input terminal, a second (n−1)th stage signal input terminal, a (n+1) th stage signal input terminal, a first output terminal, and a second output terminal, wherein the first output terminal of the nth stage GOA unit is provided for driving an active zone of an array substrate; the first (n −1)th stage signal input terminal, the second (n −1)th stage signal input terminal, and the (n+1)th stage signal input terminal of the nth stage GOA unit are respectively and electrically connected to the first output terminal and the second output terminal of the (n −1)th GOA unit and the first output terminal of the (n+1)th GOA unit, the first output terminal of the nth stage GOA unit being electrically connected to the first (n −1)th stage signal input terminal of the (n+1)th GOA unit and the (n+1) th stage signal input terminal of the (n −1)th GOA unit, the second output terminal of the nth stage GOA unit being electrically connected to the second (n −1)th stage signal input terminal of the (n+1) th GOA unit;
for the nth stage GOA unit at the first stage of the GOA circuit, the nth stage GOA unit comprises a first (n −1)th stage signal input terminal, a second (n −1)th stage signal input terminal, a (n+1)th stage signal input terminal, a first output terminal, and a second output terminal, wherein the first output terminal of the nth stage GOA unit is provided for driving an active zone of an array substrate; the first (n −1)th stage signal input terminal and the second (n −1)th stage signal input terminal of the nth stage GOA unit both provided for receiving an input of a pulse activation signal and the (n+1) th stage signal input terminal is electrically connected to the first output terminal of the (n+1)th GOA unit, the first output terminal and the second output terminal of the nth stage GOA unit being respectively and electrically connected to the first (n −1)th stage signal input terminal and the second (n −1)th stage signal input terminal of the (n+1) th GOA unit;
for the nth stage GOA unit at the last stage of the GOA circuit, the nth stage GOA unit comprises a first (n −1)th stage signal input terminal, a second (n −1)th stage signal input terminal, a (n+1) th stage signal input terminal, a first output terminal, and a second output terminal; the first (n −1)th stage signal input terminal and a second input terminal of the nth stage GOA unit are respectively and electrically connected to the first output terminal and the second output terminal of the (n −1)th GOA unit, the (n+1)th stage signal input terminal of the nth stage GOA unit being provided to receive an input of a pulse activation signal, the first output terminal of the nth stage GOA unit being electrically connected to the (n+1)th stage signal input terminal of the (n −1)th GOA unit and the second output terminal being open;
for each nth stage GOA unit between the first stage and the last stage of the GOA circuit, the nth stage GOA unit further comprises a first clock signal input terminal, a first low level input terminal, and a second low level input terminal, the first low level input terminal being provided for receiving an input of a first low level, the second low level input terminal being provided for receiving an input of a second low level, the second low level being smaller than the first low level;
for each nth stage GOA unit between the first stage and the last stage of the GOA circuit, the nth stage GOA unit further comprises:
a pull-up control unit, which is electrically connected to the first (n −1)th stage signal input terminal and the second (n −1)th stage signal input terminal;
a pull-up unit, which is electrically connected to the pull-up control unit and the first clock signal input terminal, the first output terminal, and the second output terminal;
a first pull-down holding unit, which is electrically connected to the first low level input terminal, the second low level input terminal, the pull-up control unit, and the pull-up unit;
a second pull-down holding unit, which is electrically connected to the first low level input terminal, the second low level input terminal, the first pull-down holding unit, the pull-up control unit, and the pull-up unit; and
a pull-down unit, which is electrically connected to the (n+1)th stage signal input terminal, the first low level input terminal, the pull-up control unit, the pull-up unit, the first pull-down holding unit, the second pull-down holding unit, and the first output terminal;
wherein the first clock signal input terminal has an input signal that is a first clock signal or a second clock signal, the first clock signal being opposite in phase to the second clock signal; when the input signal of the first clock signal input terminal of the nth stage GOA unit of the GOA circuit is the first clock signal, the input signal of the first clock signal input terminal of the (n+1)th stage GOA unit of the GOA circuit is the second clock signal;
wherein the pull-up control unit is a first thin-film transistor and the first thin-film transistor comprises a first gate terminal, a first source terminal, and a first drain terminal, wherein the first gate terminal is electrically connected to the second (n −1)th stage signal input terminal; the first source terminal is electrically connected to the first (n −1)th stage signal input terminal; and the first drain terminal is electrically connected to the first and second pull-down holding units, the pull-down unit, and the pull-up unit;

wherein the pull-up unit comprises a capacitor, a second thin-film transistor, and a third thin-film transistor and the second thin-film transistor comprises a second gate terminal, a second source terminal, and a second drain terminal and the third thin-film transistor comprises a third gate terminal, a third source terminal, and a third drain terminal, wherein the second gate terminal is electrically connected to one end of the capacitor, the first drain terminal, the third gate terminal, the first and second pull-down holding units, and the pull-down unit; the second source terminal is electrically connected to the third source terminal and the first clock signal input terminal; the second drain terminal is electrically connected to the second output terminal; and the third drain terminal is electrically connected to the first output terminal, the first and second pull-down holding units, the pull-down unit, and an opposite end of the capacitor;

wherein the pull-down unit comprises fourth and fifth thin-film transistors and the fourth thin-film transistor comprises a fourth gate terminal, a fourth source terminal, and a fourth drain terminal and the fifth thin-film transistor comprises a fifth gate terminal, a fifth source terminal, and a fifth drain terminal, wherein the fourth gate terminal is electrically connected to the fifth gate terminal and the (n+1)th stage signal input terminal; the fourth source terminal is electrically connected to a first low level input terminal and the fifth source terminal; the fourth drain terminal is electrically connected to the first drain terminal, said one end of the capacitor, the second gate terminal, the third gate terminal, and the first and second pull-down holding units; and the fifth drain terminal is electrically connected to the first output terminal, the third source terminal, said opposite end of the capacitor, and the first and second pull-down holding units; and wherein the first pull-down holding unit comprises sixth to ninth thin-film transistors and the sixth thin-film transistor comprises a sixth gate terminal, a sixth source terminal, and a sixth drain terminal; the seventh thin-film transistor comprises a seventh gate terminal, a seventh source terminal, and a seventh drain terminal; the eighth thin-film transistor comprises an eighth gate terminal, an eighth source terminal, and an eighth drain terminal; and the ninth thin-film transistor comprises a ninth gate terminal, a ninth source terminal, and a ninth drain terminal, wherein the sixth drain terminal is electrically connected to the seventh drain terminal, the eighth gate terminal, and the ninth gate terminal; the seventh gate terminal is electrically connected to the first drain terminal, the ninth drain terminal, said one end of the capacitor, the second gate terminal, the third gate terminal, the fourth drain terminal, and the second pull-down holding unit; the seventh source terminal is electrically connected to a second low level input terminal; the eighth drain terminal is electrically connected to said opposite end of the capacitor, the second pull-down holding unit, and the first output terminal; the eighth source terminal is electrically connected to the first low level input terminal; and the ninth source terminal is electrically connected to the first low level input terminal; and the second pull-down holding unit comprises tenth to thirteenth thin-film transistors and the tenth thin-film transistor comprises a tenth gate terminal, a tenth source terminal, and a tenth drain terminal; the eleventh thin-film transistor comprises an eleventh gate terminal, an eleventh source terminal, and an eleventh drain terminal; the twelfth thin-film transistor comprises a twelfth gate terminal, a twelfth source terminal, and a twelfth drain terminal; and the thirteenth thin-film transistor comprises a thirteenth gate terminal, a thirteenth source terminal, and a thirteenth drain terminal, wherein the tenth drain terminal is electrically connected to the eleventh drain terminal, the twelfth gate terminal, and the thirteenth gate terminal; the eleventh gate terminal is electrically connected to the first drain terminal, the thirteenth drain terminal, the seventh gate terminal, the ninth drain terminal, and said one end of the capacitor; the eleventh source terminal is electrically connected to the second low level input terminal; the twelfth drain terminal is electrically connected to said opposite end of the capacitor, the eighth drain terminal, and the first output terminal; the twelfth source terminal is electrically connected to the first low level input terminal; and the thirteenth source terminal is electrically connected to the first low level input terminal.

10. The GOA circuit as claimed in claim 9, wherein the nth stage GOA unit of the GOA circuit further comprises a second clock signal input terminal and a third clock signal input terminal, the sixth gate terminal and the sixth source terminal being connected to the second clock signal input terminal, the tenth gate terminal and the tenth source terminal being connected to the third clock signal input terminal, the second clock signal input terminal receiving an input of the first clock signal, the third clock signal input terminal receiving an input of the second clock signal.

11. The GOA circuit as claimed in claim 9, wherein the first pull-down holding unit further comprises a fourteenth thin-film transistor and the fourteenth thin-film transistor comprises a fourteenth gate terminal, a fourteenth source terminal, and a fourteenth drain terminal, wherein the fourteenth drain terminal is electrically connected to the sixth drain terminal, the seventh drain terminal, the eighth gate terminal, and the ninth gate terminal; and the fourteenth source terminal is electrically connected to the sixth gate terminal, the sixth source terminal, and the second clock signal input terminal; and the second pull-down holding unit further comprises a fifteenth thin-film transistor and the fifteenth thin-film transistor comprises a fifteenth gate terminal, a fifteenth source terminal, and a fifteenth drain terminal, wherein the fifteenth drain terminal is electrically connected to the tenth drain terminal, the eleventh drain terminal, the twelfth gate terminal, and the thirteenth gate terminal and the fifteenth source terminal is electrically connected to the tenth gate terminal and the tenth source terminal.

12. The GOA circuit as claimed in claim 11, wherein the nth stage GOA unit of the GOA circuit further comprises a second clock signal input terminal and a third clock signal input terminal; the sixth gate terminal, the sixth source terminal, and the fourteenth source terminal are connected to the second clock signal input terminal; the fourteenth gate terminal is connected to the third clock signal input terminal; the tenth gate terminal, the tenth source terminal, and the fifteenth source terminal are connected to the third clock signal input terminal; the fifteenth gate terminal is connected to the second clock signal input terminal; and the second clock signal input terminal receives an input of the first clock signal and the third clock signal input terminal receives an input of the second clock signal.

13. The GOA circuit as claimed in claim 11, wherein the nth stage GOA unit of the GOA circuit further comprises a first low frequency signal input terminal and a second low frequency input terminal, the sixth gate terminal; the sixth source terminal and the fourteenth source terminal are connected to the first low frequency signal input terminal; the fourteenth gate terminal is connected to the second low frequency signal input terminal; the tenth gate terminal, the tenth source terminal, and the fifteenth source terminal are connected to the second low frequency signal input terminal; the fifteenth gate terminal is connected to the first low frequency signal input terminal; and the first low frequency signal input terminal receives an input of a low frequency signal or an ultralow frequency signal and the second low frequency signal input terminal receives an input of a low frequency signal or an ultralow frequency signal.

* * * * *